United States Patent
Hirota et al.

(10) Patent No.: US 10,137,570 B2
(45) Date of Patent: Nov. 27, 2018

(54) LINK-TYPE TRANSFER ROBOT

(71) Applicant: NATIONAL INSTITUTE OF ADVANCED INDUSTRIAL SCIENCE AND TECHNOLOGY, Tokyo (JP)

(72) Inventors: Kenji Hirota, Ibara (JP); Shinichi Imai, Ibara (JP); Shiro Hara, Tsukuba (JP); Hitoshi Maekawa, Tsukuba (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 14/647,366

(22) PCT Filed: Nov. 26, 2013

(86) PCT No.: PCT/JP2013/081726
§ 371 (c)(1),
(2) Date: May 26, 2015

(87) PCT Pub. No.: WO2014/087879
PCT Pub. Date: Jun. 12, 2014

(65) Prior Publication Data
US 2015/0321347 A1     Nov. 12, 2015

(30) Foreign Application Priority Data
Dec. 4, 2012   (JP) ................................. 2012-265076

(51) Int. Cl.
*B25J 9/10* (2006.01)
*B25J 18/04* (2006.01)
(Continued)

(52) U.S. Cl.
CPC ............... *B25J 9/106* (2013.01); *B25J 9/104* (2013.01); *B25J 9/1065* (2013.01); *B25J 18/02* (2013.01);
(Continued)

(58) Field of Classification Search
CPC .......... H01L 21/67706; H01L 21/67742; B25J 9/104; B25J 9/1065; B25J 9/041; B25J 9/042; B25J 18/02
(Continued)

(56) References Cited

U.S. PATENT DOCUMENTS 5,106,258 A * 4/1992 Orii ...................... B65G 47/904
414/733
8,376,685 B2 * 2/2013 Pietrantonio ............ B25J 9/042
414/744.5
(Continued)

FOREIGN PATENT DOCUMENTS

JP   S61-152387 A   7/1986
JP   S62-234911 A   10/1987
(Continued)

OTHER PUBLICATIONS

International Search Report dated Nov. 26, 2013 in corresponding International Patent Application No. PCT/JP2013/081726.

*Primary Examiner* — Ronald P Jarrett
(74) *Attorney, Agent, or Firm* — Staas & Halsey LLP

(57) ABSTRACT

The present invention provides a transfer robot which has a simple structure and a small occupied area in an operation. A transfer robot of the present invention includes a support member fixed to a side wall or the like, a transfer arm by which a hand member is held capable of linear movement, and first and second link members. One end portions of the first and second link members are rotatably linked to the support member, respectively. Another end portions of the
(Continued)

first and second link members are rotatably linked to the transfer arm, respectively. The hand member holds/transfers a work. A rotational driving force applied to a linking portion between the support member and the first link member is transmitted to the transfer arm by a predetermined mechanism and linearly moves the hand member. The transfer arm moves by rotating the first link member or the second link member.

15 Claims, 17 Drawing Sheets

(51) Int. Cl.
  *H01L 21/677* (2006.01)
  *B25J 18/02* (2006.01)
(52) U.S. Cl.
  CPC ........ *B25J 18/04* (2013.01); *H01L 21/67706* (2013.01)
(58) Field of Classification Search
  USPC ..... 414/744.5, 917; 74/490.04; 901/15, 176, 901/21
  See application file for complete search history.

(56) References Cited

U.S. PATENT DOCUMENTS

| | | | |
|---|---|---|---|
| 2001/0014268 A1* | 8/2001 | Bryson, III | ........... C23C 14/566 414/217 |
| 2004/0052626 A1* | 3/2004 | Oem | ................ H01L 21/68707 414/680 |
| 2014/0017056 A1* | 1/2014 | Hosek | .................. B25J 11/0095 414/749.1 |

FOREIGN PATENT DOCUMENTS

| | | | |
|---|---|---|---|
| JP | S62-268312 | A | 11/1987 |
| JP | S63-229289 | A | 9/1988 |
| JP | H07-067217 | B | 7/1995 |
| JP | H08-155876 | A | 6/1996 |
| JP | H10-050797 | A | 2/1998 |
| JP | H11-016981 | A | 1/1999 |
| JP | 2000-254881 | A | 9/2000 |
| JP | 2012-169690 | A | 9/2012 |

* cited by examiner

LINK-TYPE TRANSFER ROBOT

CROSS REFERENCE TO RELATED APPLICATIONS

This application is a U.S. National Stage application, which claims the benefit under 35 U.S.C. § 371, of PCT International Patent Application No. PCT/JP2013/081726, filed Nov. 26, 2013, which is based on and claims the foreign priority benefit of Japanese Patent Application No. 2012-265076, filed Dec. 4, 2012, the entire disclosures of which are herein incorporated by reference as a part of this application.

TECHNICAL FIELD

The present invention relates to a link-type transfer robot for transferring a work such as a semiconductor wafer or the like, for example. The present invention can be mounted on a compact manufacturing apparatus for manufacturing a device using a small-sized work, for example.

BACKGROUND ART

As a robot for transferring a work, a transfer robot with an articulated structure called a scalar type is used in general. The scalar-type transfer robot is disclosed in Japanese Patent Laid-Open No. 2012-169690, for example.

In the transfer robot in Japanese Patent Laid-Open No. 2012-169690, by independently rotating a linking portion between a body 14 and a first arm 12, a linking portion between the first arm 12 and a second arm 13, and a linking portion between the second arm 13 and a hand 10, respectively, a folding operation or an expanding/contracting operation of the arms composed of the first arm 12, the second arm 13, and the hand 10 is performed, whereby horizontal movement is realized. Moreover, by moving up/down the body 14 itself by using a linear shaft, vertical movement is realized (see FIGS. 4 and the like in Japanese Patent Laid-Open No. 2012-169690).

SUMMARY OF INVENTION

Technical Problem

In recent years, a demand for production of semiconductor devices in many kinds in small quantities has been growing. Moreover, if a semiconductor device is produced by way of trial in research and development and the like, it is desirable that the semiconductor device is manufactured in the number of one or by the unit of several pieces.

Moreover, if a product of the one type is to be produced in mass in a large-scale factory, it is extremely difficult to adjust a production amount in accordance with a change in demand of the market. That is because a small-quantity production cannot ensure profits covering an operation cost of the factory.

In addition, since a semiconductor manufacturing factory requires high amounts of building investment and operating costs, it has a defect that medium- to small-sized businesses cannot enter the market easily.

From the reasons as described above, a technology for inexpensively performing production of the semiconductor device in many kinds in small quantities in small-sized manufacturing factories and the like by using a semiconductor wafer with a small diameter and a compact manufacturing apparatus is in demand.

However, since the prior-art transfer robot as described above needs to perform the arm folding operation for horizontal movement, it has a large occupied area and is not suitable for a compact semiconductor manufacturing apparatus.

Moreover, in order to reduce dusts in a chamber in which the transfer robot is installed and the like, a driving mechanism of the transfer robot is preferably arranged outside the chamber, but in this case, in order to install the transfer robot in a non-atmospheric pressure chamber (a vacuum chamber or a high-pressure chamber), sealing of a chamber wall is needed. However, if a linear shaft is used as described above, the sealing of the chamber wall is not easy.

Furthermore, in order to vertically move the entire arm mechanism by using the linear shaft, power of the driving mechanism needs to be extremely large, which is contrary to the demand for size reduction.

Such problems occur not only in the semiconductor manufacturing apparatus but also in an apparatus for manufacturing an electronic device by applying processes on a sapphire substrate, an aluminum substrate and the like, an apparatus for manufacturing an optical device and the like, for example.

The present invention has an object to provide a transfer robot having a simple structure and a small occupied area in an operation.

Solution to Problem

A link-type transfer robot of the present invention includes a hand portion to hold a work, a transfer arm to hold the hand portion capable of linear movement, a support member with a fixed position, first and second link members each having one end portion rotatably linked to the support member and the other end portion rotatably linked to the transfer arm, an arm driving portion for linearly moving the hand portion with respect to the transfer arm by using power transmitted from a linking portion between the first link member and the support member, and a link driving portion to move the transfer arm by rotary driving the first or the second link member with respect to the support member.

In the present invention, it is preferably configured so that the hand portion is moved vertically by that, when the link driving portion moves the transfer arm, the arm driving portion relatively moves the hand portion in a direction canceling a horizontal movement component of the transfer arm.

In the present invention, the transfer arm is preferably an expandable/contractible transfer arm configured to expand/contract by relative movement of the arm member in plural stages.

In the present invention, it is preferably configured such that the transfer arm includes a driving pulley rotatably supported in the vicinity of one of end portions of an arm body and driven by the arm driving portion, a driven pulley rotatably supported in the vicinity of the other end portion of the arm body, and an arm belt wound between the driving pulley and the driven pulley, and is configured such that the arm driving portion has a first rotating shaft penetrating the support member and the first link member and, the arm belt is rotationally moved by transmission of a rotational driving force of the first rotating shaft to the driving pulley, and the hand portion is linearly moved by using the rotational moving force of the arm belt.

In the present invention, it is preferably configured such that the driving pulleys are provided in plural along the same rotating shaft, the driven pulleys are provided in plural along the same rotating shaft, the first rotating shaft includes a plurality of concentric rotating shafts, the arm belts are wound between the corresponding driving pulleys and driven pulleys, respectively, a plurality of the hand portions are provided in correspondence with each of the arm belts, the arm belts are rotated by transmitting a rotational driving force from each of concentric rotating shafts provided in the first rotating shaft to the concentric rotating shafts of the corresponding driving pulleys, respectively, and the corresponding hand portions are linearly moved by using the rotational moving force of the respective arm belts.

In the present invention, it is preferably configured such that the link driving portion has a second rotating shaft penetrating the support member and fixed to the second link member, and the second link member is rotary driven by rotating the second rotating shaft.

In the present invention, it is preferably configured such that the link driving portion has the second rotating shaft which is a rotating shaft concentric to the first rotating shaft, and the second rotating shaft is fixed to the first link member and rotary drives the first link member by rotating the second rotating shaft.

Advantageous Effects of the Invention

In the link-type transfer robot of the present invention, since a parallel link mechanism is composed of the transfer arm, the support member, and the first and second link members, a distance between the support member and the transfer arm is a length of the first or second link member, which is constant at all times. Thus, according to the present invention, a rotational power supplied to the linking portion between this support member and the first link member can be easily transmitted to the transfer arm. By linearly moving the hand portion on the transfer arm by this rotational power, the work can be transferred in a horizontal direction. As described above, since the link-type transfer robot of the present invention can horizontally transfer the work without performing the arm folding operation as the scalar-type transfer robot, its structure can be simplified, and moreover, since an occupied area is small, it can be mounted on a compact apparatus easily.

Moreover, in the link-type transfer robot of the present invention, since the transfer arm can be moved by the rotational driving force, when the transfer arm is mounted in the chamber in a non-atmospheric pressure environment (a vacuum chamber, for example) and when the driving mechanism is arranged outside the chamber, sealing of the chamber wall is easier than the case using the linear shaft. Moreover, since the rotational driving force is used, the driving power can be reduced, and thus, size reduction and cost reduction are easy.

In the present invention, by relatively moving the hand portion in the direction canceling the horizontal movement component of the transfer arm, regardless of use of the parallel link mechanism as above, the hand portion can be vertically moved.

In the present invention, by using the expandable/contractible transfer arm, a sufficient moving distance can be obtained by using a small-sized parallel link mechanism.

In the present invention, by configuring such that a rail portion, the driving pulley, the driven pulley, and the arm belt as above are used and the rotational driving force of the first rotating shaft is transmitted to the driving pulley, the hand portion can be linearly moved with a simple configuration.

In the present invention, by providing a plurality of the driving pulleys and driven pulleys along the respective same rotating shafts and by providing a plurality of the concentric rotating shafts on the first rotating shaft, the plurality of hand portions can be provided on the one transfer arm so as to be operated individually.

Moreover, in the present invention, since the position of the above-described support member is fixed, the second rotating shaft linking the support member and the second link member is not moved when the transfer arm is moved. Therefore, by configuring such that the second link member is rotated by the rotational force of this second rotating shaft, the transfer arm can be moved in a state in which the position of a power source is fixed.

In the present invention, by constituting the first and second rotating shafts by the concentric rotating shafts, a spot where the rotating shaft is penetrated in the support member can be one spot. Thus, it has advantages that a sealing spot when the power source is to be installed outside the chamber can be one and the like, for example.

BRIEF DESCRIPTION OF DRAWINGS

FIG. 11 are views schematically illustrating the constitution of the link-type transfer robot according to the embodiment 3, in which FIG. 11(a) is a plan view and FIG. 11(b) is a side view.

DESCRIPTION OF EMBODIMENTS

[Embodiment 1]

A link-type transfer robot according to an embodiment 1 of the present invention will be described below by referring to FIGS. 1 to 4.

Figure 1:
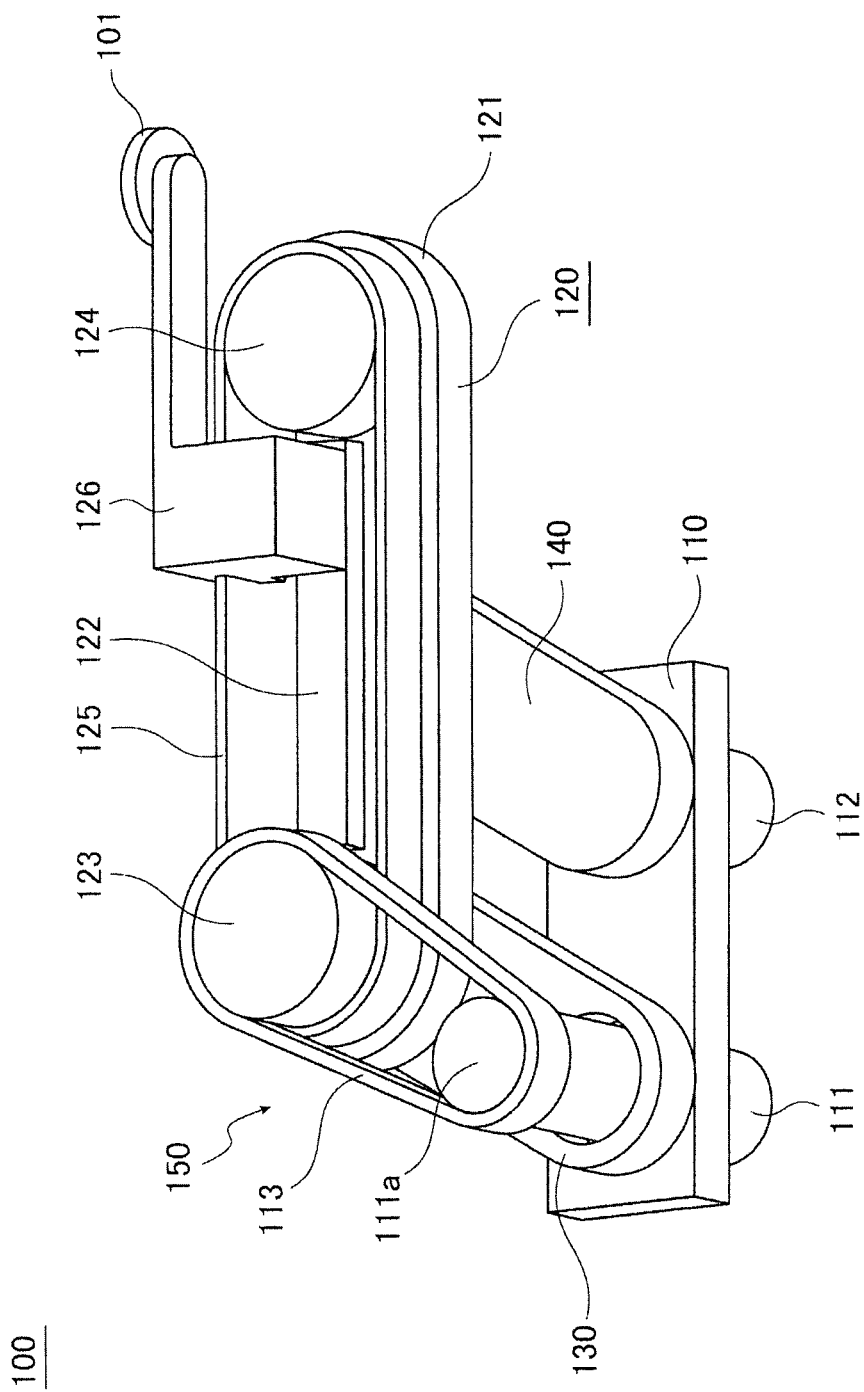
FIG. 1 is a perspective view schematically illustrating a constitution of a link-type transfer robot according to an embodiment 1.

FIG. 1 is a perspective view schematically illustrating a constitution of the link-type transfer robot according to this embodiment 1.

As illustrated in FIG. 1, the link-type transfer robot 100 of this embodiment 1 includes a support member 110, a transfer arm 120, first and second link members 130 and 140. In this embodiment 1, a parallel link mechanism 150 is composed of these constituent members 110 to 140.

The support member 110 is fixed to a side wall or the like (not shown) of a chamber (a vacuum chamber or the like, for example) in which the link-type transfer robot 100 is to be installed. The support member 110 includes two through holes (not shown) aligned substantially in the horizontal direction, and a first rotating shaft 111 and a second rotating shaft 112 are rotatably inserted into these through holes. To the first rotating shaft 111 and the second rotating shaft 112, separate rotational driving sources (electric motor or the like, for example), not shown, are connected, respectively, and the rotating shafts 111, 112 are individually rotated by the rotational driving forces of these rotational driving sources.

The transfer arm 120 transfers a work (a transfer target such as a semiconductor wafer or the like) 101 in the horizontal direction. For that purpose, the transfer arm 120 includes an arm body 121, a rail 122, a driving pulley 123, a driven pulley 124, an arm belt 125, a hand portion 126 and the like. The rail 122 is fixed to one of side surfaces of the arm body 121. The driving pulley 123 is arranged on a rear end side of the rail 122 and rotatably held on the one side surface of the arm body 121. On the other hand, the driven pulley 124 is arranged on a tip end side of the rail 122 and is rotatably held on the one side surface of the arm body 121. Between the driving pulley 123 and the driven pulley 124, the arm belt 125 is wound. The hand portion 126 is held on the rail 122, capable of horizontal movement, and is fixed to a predetermined spot of the arm belt 125. As a result, the hand portion 126 linearly moves along the rail 122 with rotation of the arm belt 125. On the hand portion 126, the work 101 is held.

The first link member 130 is rotatably linked to the support member 110 on a lower end portion and is also rotatably linked to the transfer arm 120 on an upper end portion. In this embodiment 1, a through hole is provided on the lower end portion of the first link member 130, and by inserting the first rotating shaft 111 through this through hole, the first link member 130 is linked to the support member 110. Moreover, the upper end portion of the first link member 130 is linked to the transfer arm 120 by using a rotating shaft (not shown) provided on the other side surface (that is, the side surface on which the driving pulley 123 or the like is not provided) of the transfer arm 120, for example. A pulley 111a is fixed to the first rotating shaft 111, and a driving belt 113 is wound between this pulley 111a and the driving pulley 123. A rotation center of the rotating shaft linking the first link member 130 and the transfer arm 120 is preferably matched with a rotation center of the driving pulley 123. As a result, even if a rotational movement angle of the first link member 130 is changed, a distance between the first rotating shaft 111 and the driving pulley 123 is made constant, and thus, the driving belt 113 can be wound.

The second link member 140 is rotatably linked to the support member 110 on a lower end portion and is also rotatably linked to the transfer arm 120 on an upper end portion. In this embodiment 1, the lower end portion of the second link member 140 is fixed/linked to the second rotating shaft 112. A linking position of the second link member 140 is preferably set so as to be parallel with the first link member 130.

Subsequently, an operation of the link-type transfer robot 100 according to this embodiment 1 will be described by using FIGS. 2 to 4.

Figure 2:
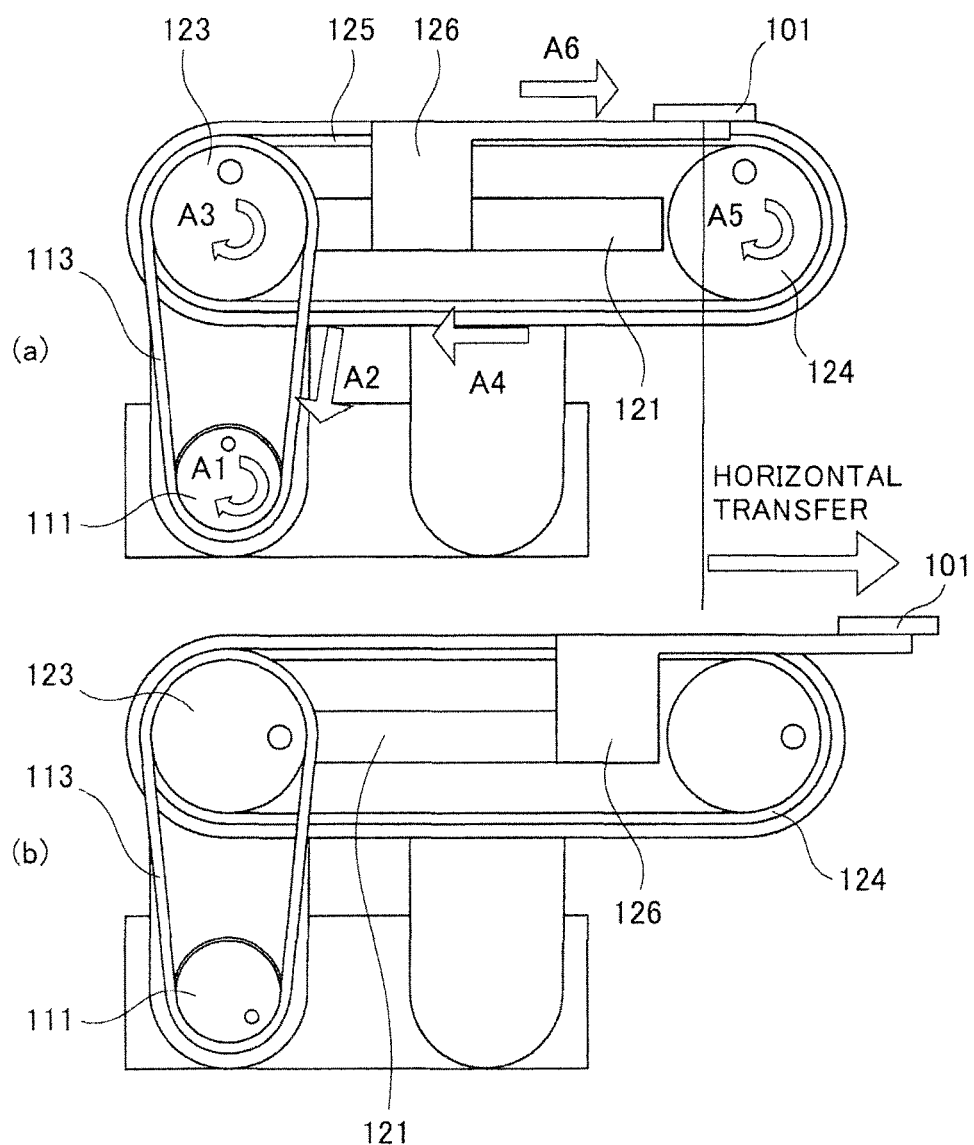
In FIGS. 2, (a) and 2(b) are both schematic side views for explaining an operation of the link-type transfer robot according to the embodiment 1.

FIG. 2 are schematic side views for explaining an operation of the hand portion 126 in this embodiment 1.

In a state illustrated in FIG. 2(a), when the rotation driving source, not shown, rotates the first rotating shaft 111 in a clockwise direction (see reference character A1), the driving belt 113 is rotationally moved by this rotation (see reference character A2), and as a result, the driving pulley 123 also rotationally moves in the clockwise direction (see reference character A3). As described above, around the driving pulley 123, the arm belt 125 is also wound in addition to the driving belt 113, and thus, this arm belt 125 is also rotationally moved in the clockwise direction (see reference character A4). As a result, the driven pulley 124 is also rotated (see reference character A5). By means of rotational movement of the arm belt 125 as above, the hand portion 126 fixed to the predetermined spot of this arm belt 125 is linearly moved along the rail 121. As a result, as illustrated in FIG. 2(b), the work 101 held by the hand portion 126 is horizontally transferred forward.

On the other hand, if the rotational driving source rotates the first rotating shaft 111 in a counterclockwise direction, the work 101 is horizontally transferred backward by an operation opposite to FIGS. 2(a) and 2(b).

Figure 3:
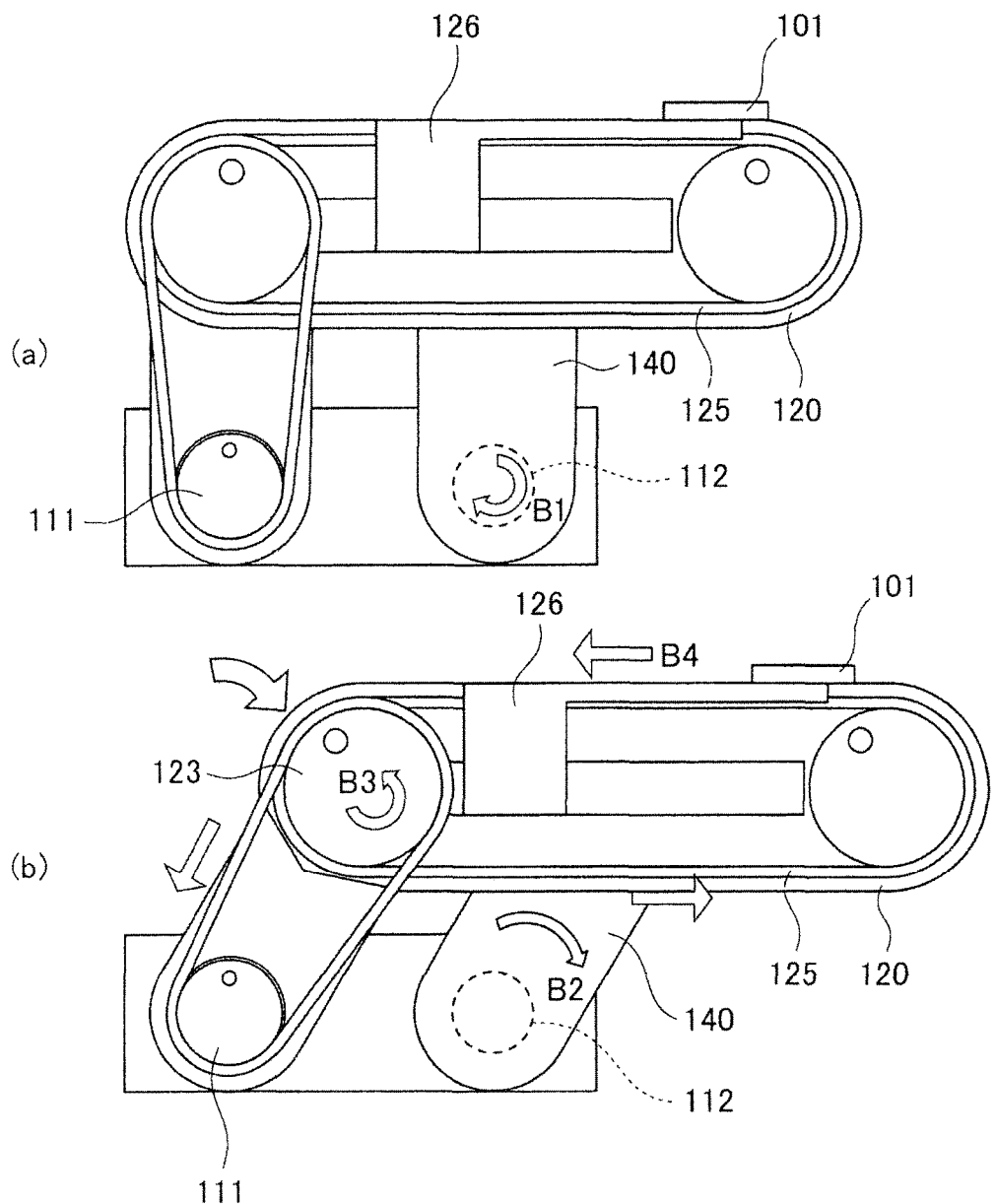
In FIGS. 3, (a) and 3(b) are both schematic side views for explaining the operation of the link-type transfer robot according to the embodiment 1.

FIG. 3 is a schematic side view for explaining an operation of the parallel link mechanism 150 in this embodiment 1.

In a state illustrated in FIG. 3(a), when the rotational driving source, not shown, rotates the second rotating shaft 112 in the clockwise direction (see reference character B1), the second link member 140 is rotationally moved in the clockwise direction by this rotation (see reference character B2 in FIG. 3(b)). As a result, the transfer arm 120 moves downward to the front while holding horizontal. Then, the work 101 can be transferred forward only by a distance corresponding to a horizontal component of this movement.

If the first rotating shaft 111 is not rotated, the driving pulley 123 rotates in the counterclockwise direction with this downward movement to the front (see reference character B3). As a result, since the arm belt 125 rotationally moves in the counterclockwise direction, the hand portion 126 moves rearward (see reference character B4), and the work 101 also retreats on the transfer arm 120. That is, by rotation of the driving pulley 123, a part of the horizontal movement of the work 101 is cancelled. However, by rotating the first rotating shaft 111 in the clockwise direction as described above and by moving the hand portion 126, the work 101 can be made to advance. Thus, in this embodiment 1, a transfer distance of the work 101 can be extended by a portion of the horizontal component of the distance for which the parallel link mechanism 150 is moved. That is, the transfer distance of the work 101 is the sum of the horizontal component of the distance for which the transfer arm 120 moves and the distance for which the work 101 moves on the transfer arm 120.

On the other hand, when the second rotating shaft 112 rotates in the counterclockwise direction, the work 101 moves upward to the rear by an operation opposite to FIGS. 3(*a*) and 3(*b*).

Figure 4:
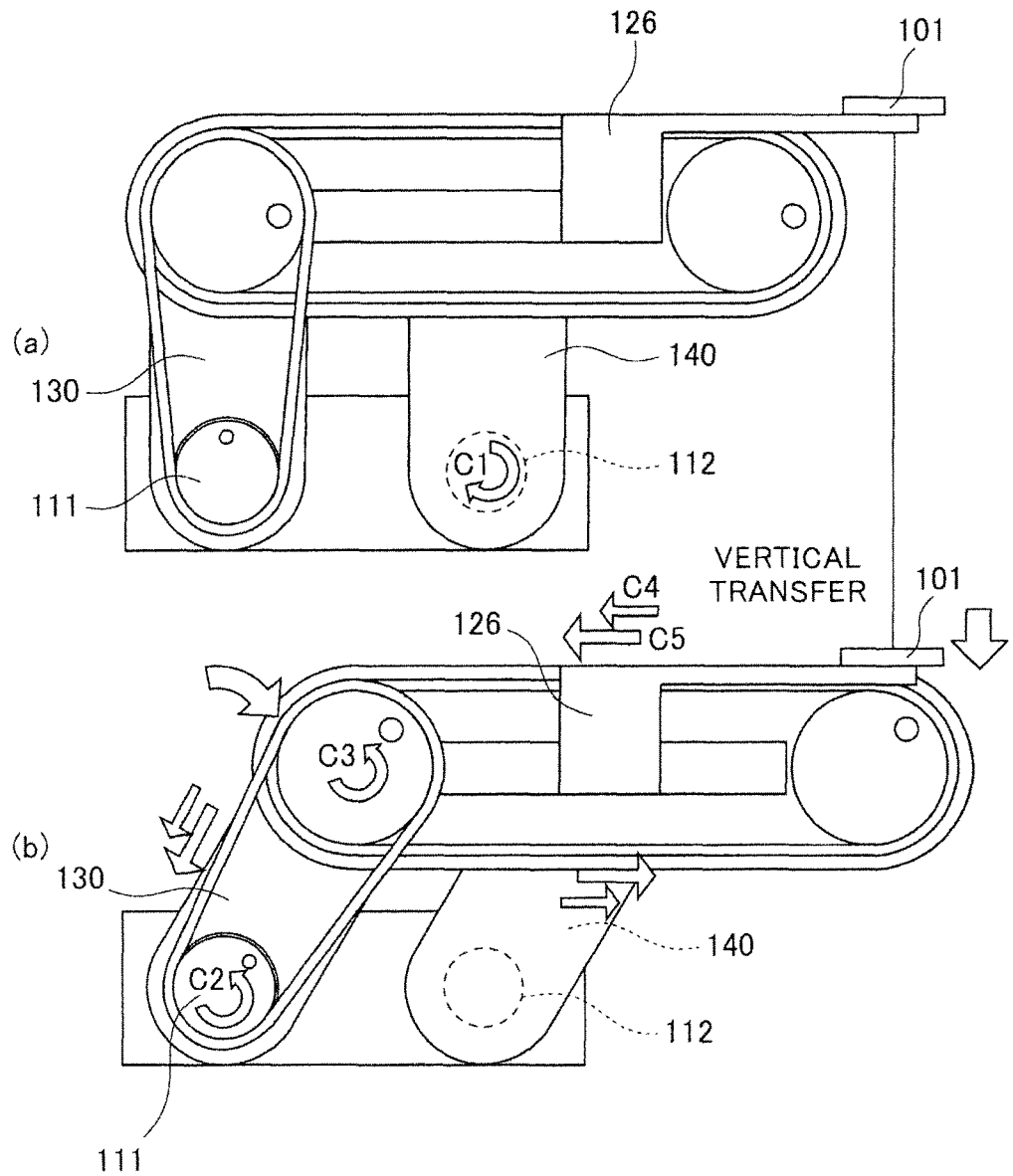
In FIGS. 4, (a) and 4(b) are both schematic side views for explaining an operation for vertically moving a hand portion in the embodiment 1.

FIG. 4 are schematic side views for explaining an operation for vertically moving the hand portion 126. As will be described below, the vertical movement of the work 101 is realized by combining movement by the transfer arm 120 (see FIG. 2) as described above and an operation of the parallel link mechanism 150 (see FIG. 3).

In a state illustrated in FIG. 4(*a*), when the second rotating shaft 112 is rotated in the clockwise direction (see reference character C1), as described above, the transfer arm 120 moves downward to the front. That is, a moving speed of the transfer arm 120 by rotation of the second rotating shaft 112 has a horizontal component and a vertical component. Therefore, by rotating the first rotating shaft 111 in the counterclockwise direction at a predetermined rotational speed at the same time as the movement of the transfer arm 120 and by retreating the hand portion 126 (see reference character C2 in FIG. 4(*b*)) so as to completely cancel the horizontal component of such moving speed, the hand portion 126 can be vertically lowered.

As described above, when the transfer arm 120 advances, the driving pulley 123 rotates in the counterclockwise direction, whereby the hand portion 126 slightly retreats (see reference character C3). The rotational speed (see reference character C5) of the first rotating shaft 111 is controlled by considering the speed by this retreat (see reference character C4). Moreover, by setting a diameter ratio between the first rotating shaft 111 and the driving pulley 123 as appropriate, it is possible to vertically move the hand portion 126 without rotating the first rotating shaft 111 or to vertically move the hand portion 126 by rotating the first rotating shaft in the clockwise direction.

On the other hand, by rotating the second rotating shaft 112 in the counterclockwise direction and by rotating the first rotating shaft in the clockwise direction and the like, the hand portion 126 can be vertically raised by an operation opposite to FIGS. 4(*a*) and 4(*b*).

As described above, according to this embodiment 1, the hand portion 126 can be horizontally moved by using the rotating operation of the parallel link mechanism 150 and the operation of the hand portion 126 on the rail 122, and thus, there is no need to perform the arm folding operation for horizontal movement. Thus, the structure of the transfer robot can be simplified, and the occupied area can be kept small.

Moreover, since the horizontal movement and the vertical movement of the hand portion 126 can be performed only by rotation of the first and second rotating shafts 111 and 112, the transfer robot can be constituted without using the linear shaft. Thus, even if the power source (an electric motor or the like) of the transfer robot is arranged outside a non-atmospheric pressure chamber (a vacuum chamber or a high-pressure chamber, for example), sealing can be performed easily. Furthermore, as compared with a case in which a weight of the arm mechanism is supported by the linear shaft, the power of the power source can be kept small, and thus, size reduction or the like of the transfer robot is easily.

In this embodiment 1, as described above, the rotation center of the rotating shaft linking the first link member 130 and the transfer arm 120 is matched with the rotation center of the driving pulley 123. As a result, even if the rotational movement angle of the first link member 130 is changed, the distance between the first rotating shaft 111 and the driving pulley 123 is made constant, and thus, the rotational power can be transmitted from the support member 110 side to the transfer arm 120 side. From such reasons, in this embodiment 1, it is only necessary to link the rotational power source to the support member 110 fixed to the side wall or the like of the vacuum chamber or the like, and arrangement of the rotational power source outside the chamber is facilitated.

In this embodiment 1, the first rotating shaft 111 is used for rotational driving of the driving pulley 123, and the second rotating shaft 112 is used for rotational driving of the parallel link mechanism 150, but it is possible to constitute the link-type transfer robot so that the first rotating shaft 111 is used for rotational driving of the parallel link mechanism 150 and the second rotating shaft 112 is used for rotational driving of the driving pulley 123.

Moreover, it is also possible to constitute the link-type transfer robot by making the first rotating shaft 111 or the second rotating shaft 112 a dual-axis concentric rotating shaft so that the driving pulley 123 and the parallel link mechanism 150 are both rotated/driven by this concentric rotating shaft. As a result, the number of sealing spots when the power source is installed outside the chamber can be made one.

In this embodiment 1, the driving belt 113 is used as means for transmitting the rotational power of the first rotating shaft 111 to the driving pulley 123, but other methods (a gear or the like, for example) may be used.

In this embodiment 1, the hand portion 126 is linearly moved by using the driving pulley 123, the driven pulley 124, and the arm belt 125, but a mechanism for linearly moving the hand portion 126 is arbitrary. For example, a wire or the like may be used instead of the arm belt 125 and moreover, a rack-and-pinion or the like may be employed.

[Embodiment 2]

Subsequently, a link-type transfer robot according to an embodiment 2 of the present invention will be described. In this embodiment 2, two hand portions are mounted on one parallel link mechanism.

Figure 5A:
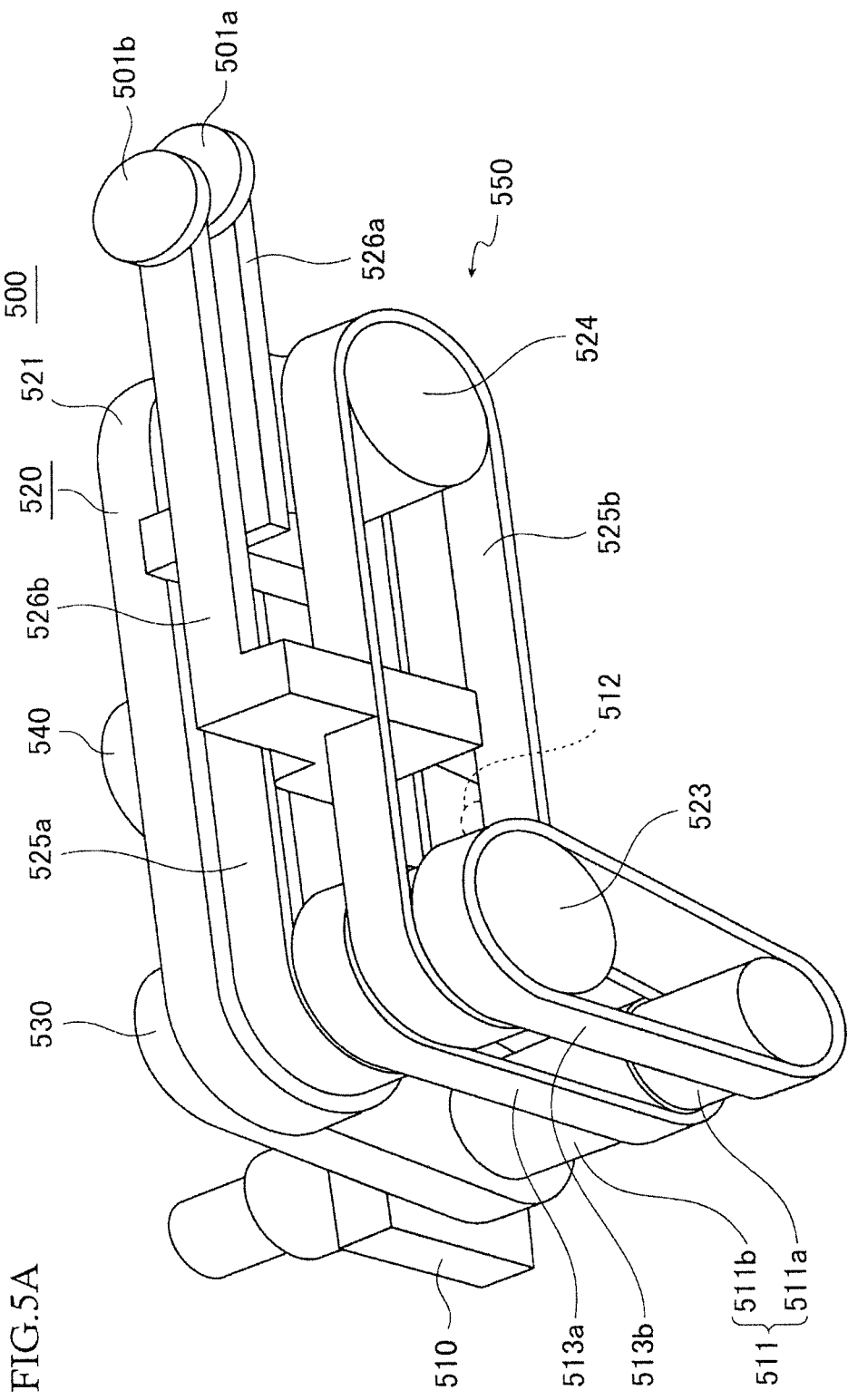
FIG. 5A is a perspective view schematically illustrating a constitution of a link-type transfer robot according to an embodiment 2.

FIG. 5A is a perspective view schematically illustrating a constitution of the link-type transfer robot according to this embodiment 2.

As illustrated in FIG. 5A, the link-type transfer robot 500 of this embodiment 2 includes a support member 510, a transfer arm 520, and first and second link members 530 and 540. In this embodiment 2, a parallel link mechanism 550 is constituted by these constituent members 510 to 540.

The support member 510 is fixed to a side wall or the like (not shown) of a vacuum chamber or the like similarly to the above-described embodiment 1, and first and second rotating shafts 511 and 512 are rotatably inserted into two through holes of the support member 510 aligned substantially in the horizontal direction. The first rotating shaft 511 includes a columnar rotating shaft 511*a* and a cylindrical rotating shaft 511*b*, and these rotating shafts 511*a* and 511*b* constitute a dual-axis concentric rotating shaft. The rotating shafts 511*a* and 511*b* are individually rotated/driven by separate rotational driving sources (an electric motor or the like, for example, not shown). On the other hand, the second rotating shaft 512 is constituted by a single rotating shaft similarly to the rotating shaft 112 of the above-described embodiment 1. This second rotating shaft 512 is also rotated/driven independently from the rotating shafts 511a and 511b by a rotational driving source, not shown.

The transfer arm 520 includes an arm body 521. In this arm body 521, a driving pulley 523 and a driven pulley 524 are provided. Between these pulleys 523 and 524, arm belts 525a and 525b are wound. Here, the pulleys 523 and 524 constitute a dual-axis concentric rotating shaft similar to the first rotating shaft 511 and thus, the arm belts 525a and 525b are rotationally moved independently and separately.

Moreover, between the driving pulley 523 and the first rotating shaft 511, first and second driving belts 513a and 513b are wound. Since the driving pulley 523 and the first rotating shaft 511 use the dual-axis concentric rotating shaft, respectively, as described above, these driving belts 513a and 513b can be also rotationally moved independently and separately.

Hand portions 526a and 526b are fixed to predetermined spots of the arm belts 525a and 525b, respectively. These hand portions 526a and 526b are held on rails, not shown, respectively, so as to be capable of separate and independent horizontal movement. These hand portions 526a and 526b are capable of holding the works 501a and 501b, respectively.

According to such constitution, by rotating the rotating shaft 511a, the hand portion 526a can be linearly moved along the rail (not shown) by rotationally moving the driving belt 513a and the arm belt 525a, and moreover, by rotating the rotating shaft 511b, the hand portion 526b can be linearly moved along the rail (not shown) by rotationally moving the driving belt 513b and the arm belt 525b. Moreover, by rotating the second rotating shaft 512, the transfer arm 520 can be advanced or retreated. Furthermore, similarly to the above-described embodiment 1, the hand portions 526a and 526b can be also vertically moved.

By using such link-type transfer robot, in a state in which the hand portion 526a is located on the tip end side of the transfer arm 520 and also the hand portion 526b is located on the rear end side, for example, the hand portion 526a is made to receive the work 501a from a work placing table (not shown) and then, the hand portion 526a is moved to the rear end side of the transfer arm 520 and also the hand portion 526b is moved to the front end side, and the work held by the hand portion 526b can be placed on the work placing table. That is, according to the link-type transfer robot of this embodiment 2, a work of carrying out the work after processing from a processing chamber and a work of carrying in a next work for processing can be performed at the same time.

Figure 5B:
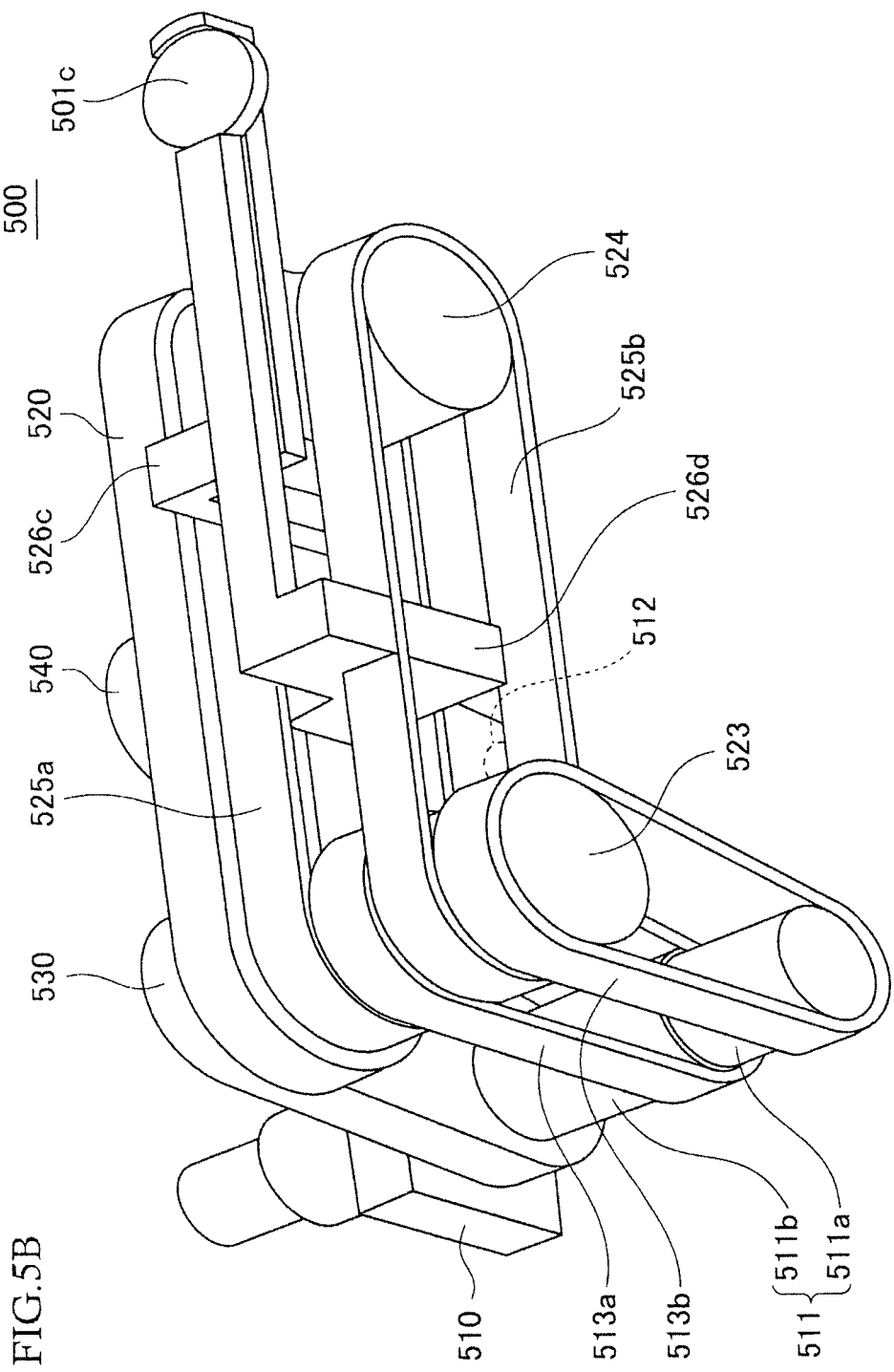
FIG. 5B is a perspective view schematically illustrating a variation of the link-type transfer robot according to the embodiment 2.

FIG. 5B is a perspective view schematically illustrating a structure of a variation of the link-type transfer robot according to this embodiment 2.

In a link-type transfer robot in FIG. 5B, a work 501c is placed on a hand portion 526c. Then by advancing a hand portion 526d, the work 501c can be sandwiched and held from front and rear by a tip end portion of this hand portion 526d and a tip end projection of the hand portion 526c. Moreover, by retreating the hand portion 526d, holding of the work 501c can be released.

According to such constitution, a chuck mechanism for holding the work 501c on the hand portion 526c can be also constituted only by a rotational power.

According to the link-type transfer robot illustrated in FIG. 5A and FIG. 5B, similarly to the above-described embodiment 1, the hand portions 526a and 526b can be horizontally moved by using a rotating operation of the parallel link mechanism 550 and linear moving operations of the hand portions 526a and 526b and thus, the arm folding operation does not have to be performed for horizontal movement and therefore, the occupied area of the transfer robot can be kept small.

Moreover, similarly to the above-described embodiment 1, since the horizontal movement and the vertical movement of the hand portions 526a and 526b can be performed only by rotation of the first and second rotating shafts 511 and 512, there is no need to use a linear shaft and thus, even if the power source (electric motor or the like) of the transfer robot is arranged outside a processing chamber (a vacuum chamber, a high-pressure chamber or the like, for example) in a non-atmospheric pressure environment, sealing can be performed easily and at the same time, power of the power source can be kept small and thus, size reduction of the transfer robot or the like is easy.

In addition, similarly to the above-described embodiment 1, by matching a rotation center of the rotating shaft linking the first link member 530 and the transfer arm 520 with the rotation center of the driving pulley 523, the rotation power can be transmitted from the support member 510 to the transfer arm 520 and thus, arrangement of the rotational power source outside the chamber is facilitated.

In this embodiment 2, the example in which the two hand portions are mounted on the one parallel link mechanism is illustrated but it is also possible to mount three or more hand portions on the one parallel link mechanism.

In this embodiment 2, the first rotating shaft 511 is used for rotational driving of the driving pulley 523 and also, the second rotating shaft 512 is used for rotational driving of the parallel link mechanism 550, but it is also possible to constitute the link-type transfer robot such that the first rotating shaft 511 is used for rotational driving of the parallel link mechanism 550 and also the second rotating shaft 512 is used for rotational driving of the driving pulley 523.

Moreover, it is also possible to constitute the link-type transfer robot such that the first rotating shaft 511 or the second rotating shaft 512 is made a tri-axis concentric rotating shaft, and all the shafts of the driving pulley 523 and the parallel link mechanism 550 are rotated/driven by this concentric rotating shaft. As a result, the number of sealing spot when the power source is installed outside the chamber can be one.

In this embodiment 2, the first and second driving belts 513a and 513b are used as means for transmitting the rotational power of the first rotating shaft 511 to the driving pulley 523, but other methods (gear or the like, for example) may be used.

In this embodiment 2, the hand portions 526a, 526b, 526c, and 526d are linearly moved by using the driving pulley 523, the driven pulley 524, and the arm belts 525a and 525b, but a mechanism for linearly moving the hand portions 526a, 526b, 526c, and 526d is arbitrary. For example, a wire or the like may be used instead of the arm belts 525a and 525b, and moreover, a rack-and-pinion or the like may be employed.

[Embodiment 3]

Subsequently, a link-type transfer robot according to an embodiment 3 of the present invention will be described. This embodiment 3 is an example in which an expandable/contractible transfer arm is mounted on the link-type transfer robot of the present invention, and this link-type transfer robot is mounted on a compact semiconductor manufacturing apparatus.

Figure 6:
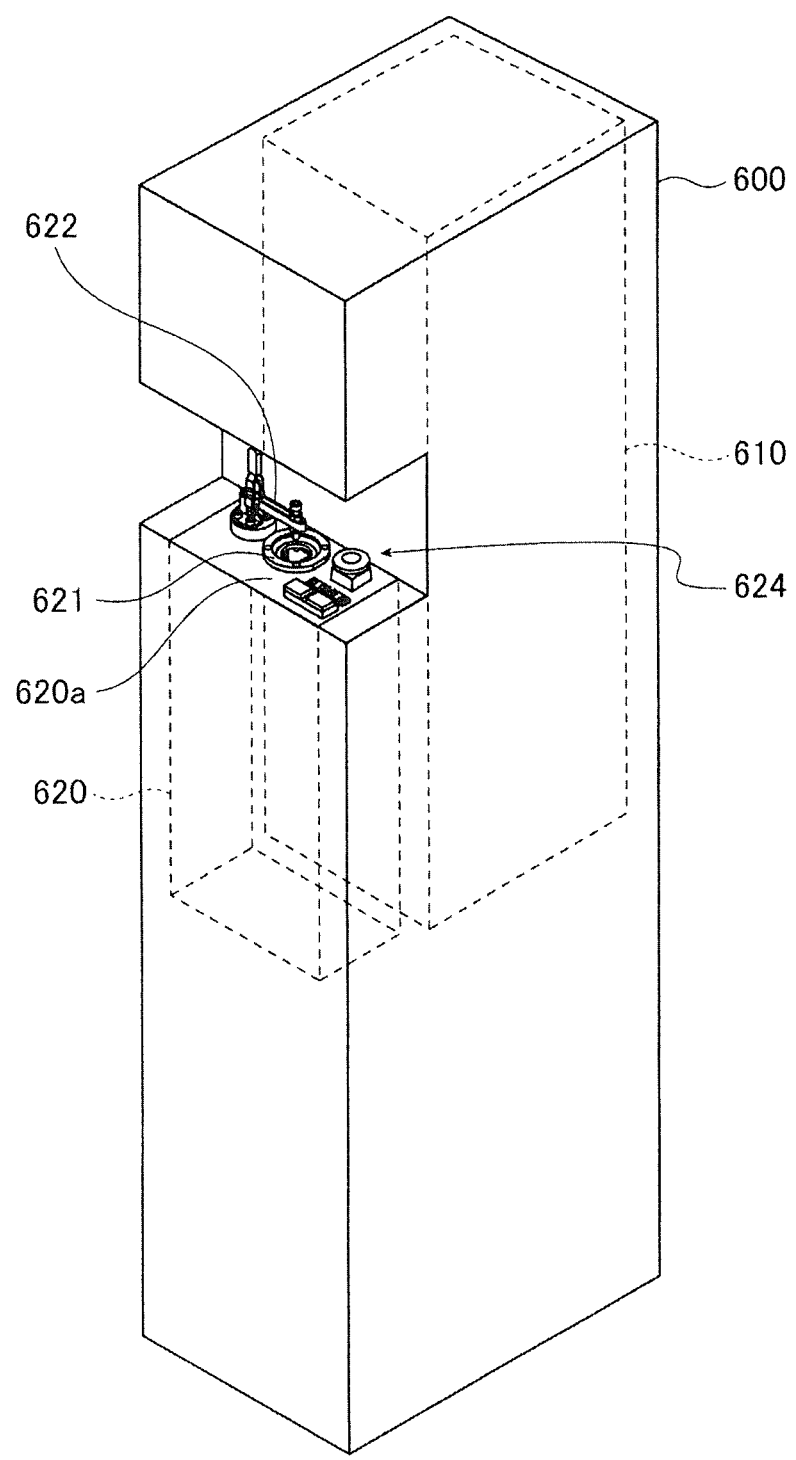
FIG. 6 is a perspective view conceptually illustrating an entire constitution of a compact semiconductor manufacturing apparatus according to an embodiment 3.
Figure 7:
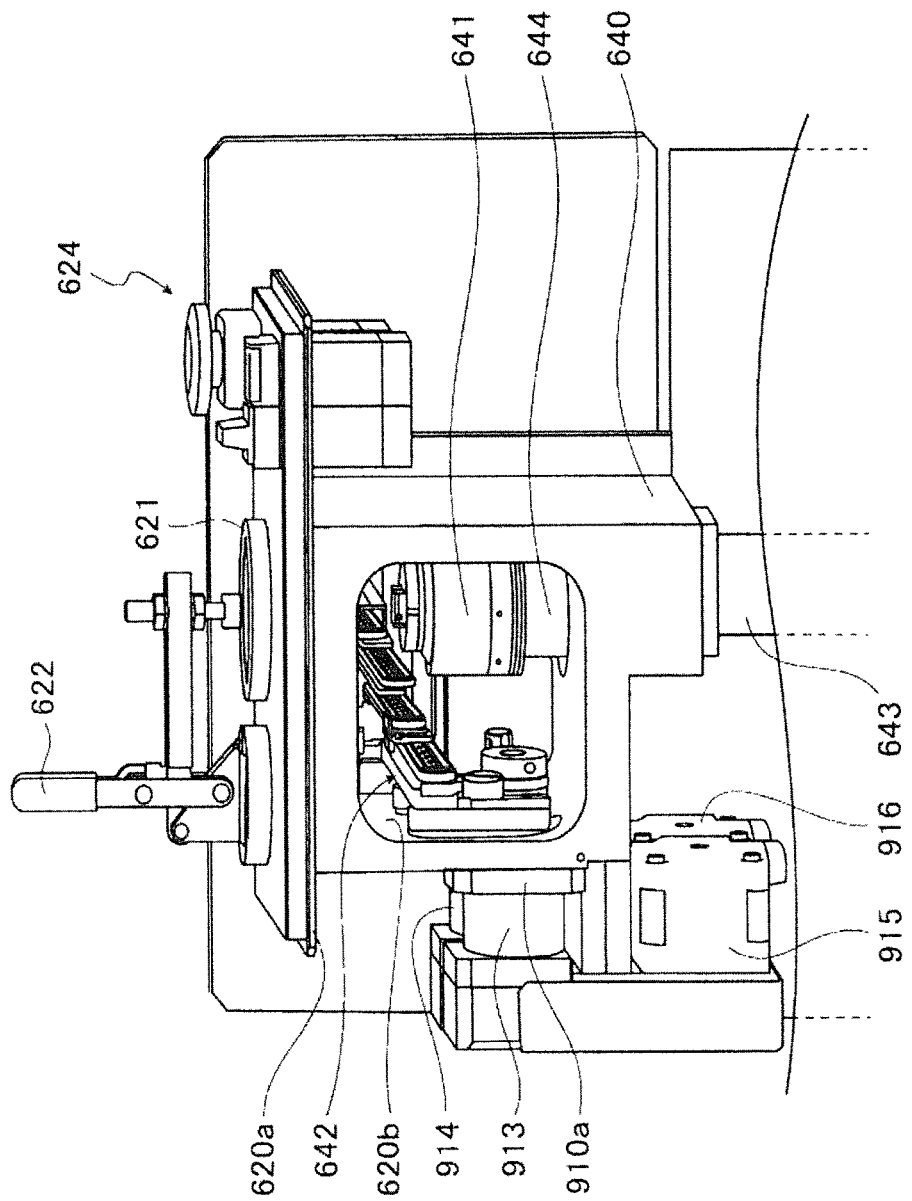
FIG. 7 is a perspective view illustrating an essential part structure of a apparatus antechamber according to the embodiment 3.
Figure 8:
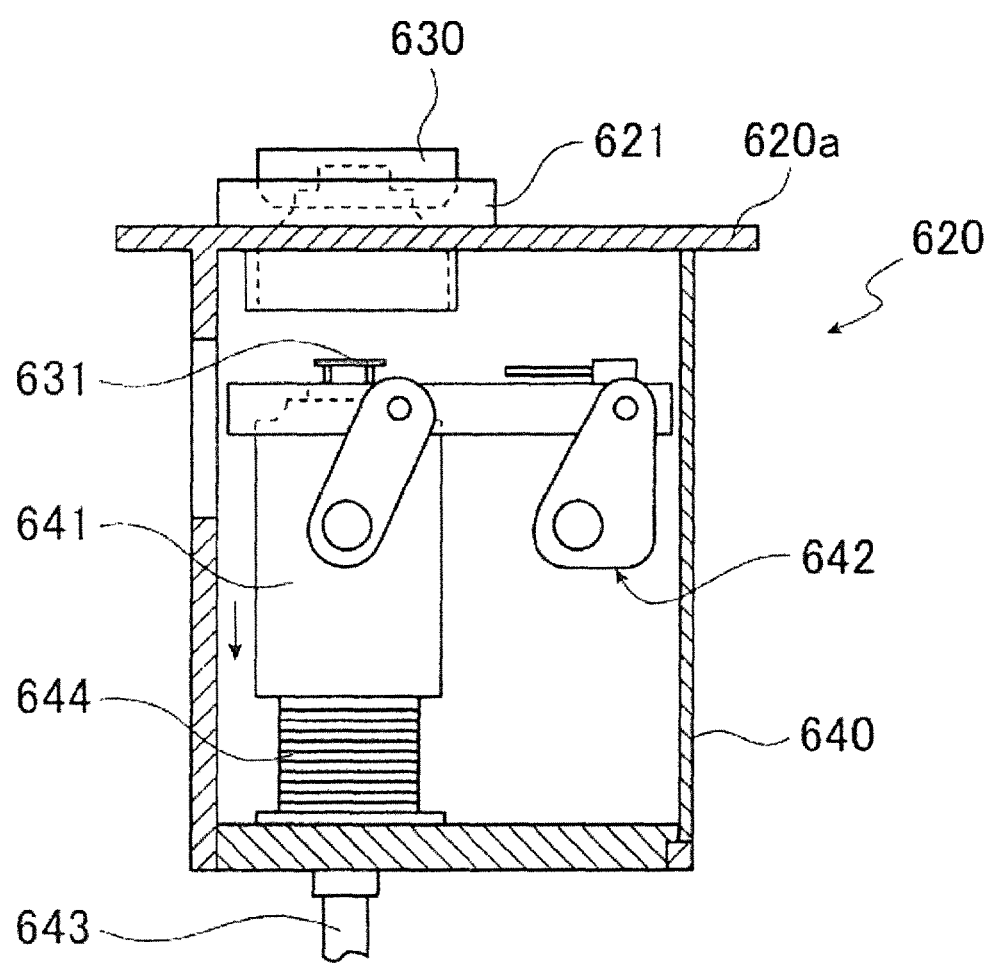
FIG. 8 is a side view roughly illustrating the essential part structure of a apparatus antechamber according to the embodiment 3.

FIG. 6 is a perspective view conceptually illustrating an entire constitution of a small-sized semiconductor manufacturing apparatus according to this embodiment 3. FIG. 7 and FIG. 8 are views illustrating an essential part structure of a apparatus antechamber, in which FIG. 7 is a back-surface perspective view, and FIG. 8 is a schematic side view.

As is known from FIGS. 6 to 8, the compact semiconductor manufacturing apparatus 600 according to this embodiment 3 accommodates a processing chamber 610 and a apparatus antechamber 620.

The processing chamber 610 receives a semiconductor wafer 631 from the apparatus antechamber 620 through a wafer transfer port, not shown. Then, it applies known processing (that is, film formation, etching, inspection processing and the like) to this semiconductor wafer 631. Detailed description of the processing chamber 610 will be omitted. In this embodiment 3, the semiconductor wafer 631 having a small diameter of 20 millimeter or less (12.5±0.2 millimeter, for example) is used.

On the other hand, the apparatus antechamber 620 is a chamber for taking out the semiconductor wafer 631 accommodated in a wafer transfer container 630 and for transferring it to the processing chamber 610.

On a top plate 620a of the apparatus antechamber 620, a container placing table 621 for placing the wafer transfer container 630 and a pressing lever 622 for pressing/fixing the placed wafer transfer container 630 from above are provided. Moreover, on the top plate 620a of the apparatus antechamber 620, an operation button 624 for operating the compact semiconductor manufacturing apparatus 600 and the like are provided.

The apparatus antechamber 620 includes a clean chamber (it may be a vacuum chamber or a high-pressure chamber) 640 into/out of which the semiconductor wafer 631 is carried. In this clean chamber 640, an elevating body 641 for carrying-in/out the semiconductor wafer 631 with respect to the wafer transfer container 630 set on the container placing table 621 and a link-type transfer robot 642 for carrying-in/out the semiconductor wafer 131 with respect to the processing chamber 610 are provided. Description of a vacuum pump or the like of the clean chamber 640 will be omitted.

On an upper surface portion of the elevating body 641, a delivery bottom portion of the wafer transfer container 630 is held in a state in which the semiconductor wafer 631 is placed. The elevating body 641 is supported by an elevating shaft 643, capable of vertical movement. This elevating shaft 643 penetrates a bottom surface of the clean chamber 640 and is linked/fixed to a center part on a lower surface of the elevating body 641 and supports the elevating body 641.

A wafer elevating bellows 644 is provided in order to maintain airtightness of the clean chamber 640. An upper end of the wafer elevating bellows 644 is air-tightly fixed to a lower-surface peripheral edge portion of the elevating body 641. Moreover, a lower end of the wafer elevating bellows 644 is air-tightly fixed to an inner side of a bottom surface of the clean chamber 640. This wafer elevating bellows 644 is expanded/contracted in a vertical direction with elevation of the elevating body 641.

Below the clean chamber 640, an elevating mechanism (not shown) is provided. An elevating shaft 643 is elevated by this elevating mechanism.

On an outside of the clean chamber 640, power transmitters 913 and 914 and electric motors 915 and 916 are arranged (details will be described later).

Figure 9:
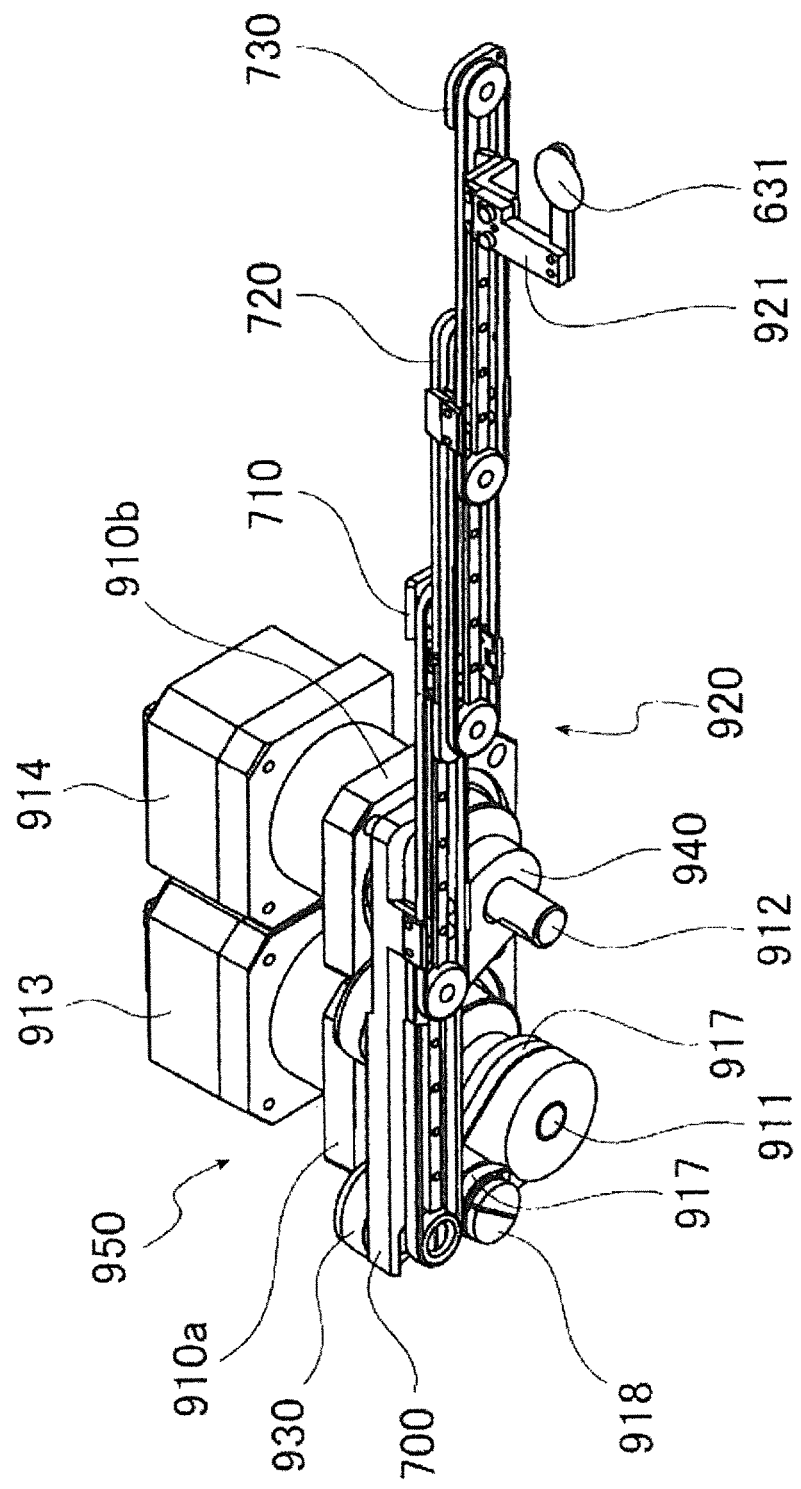
FIG. 9 is a perspective view schematically illustrating a constitution of a link-type transfer robot according to the embodiment 3.
Figure 10:
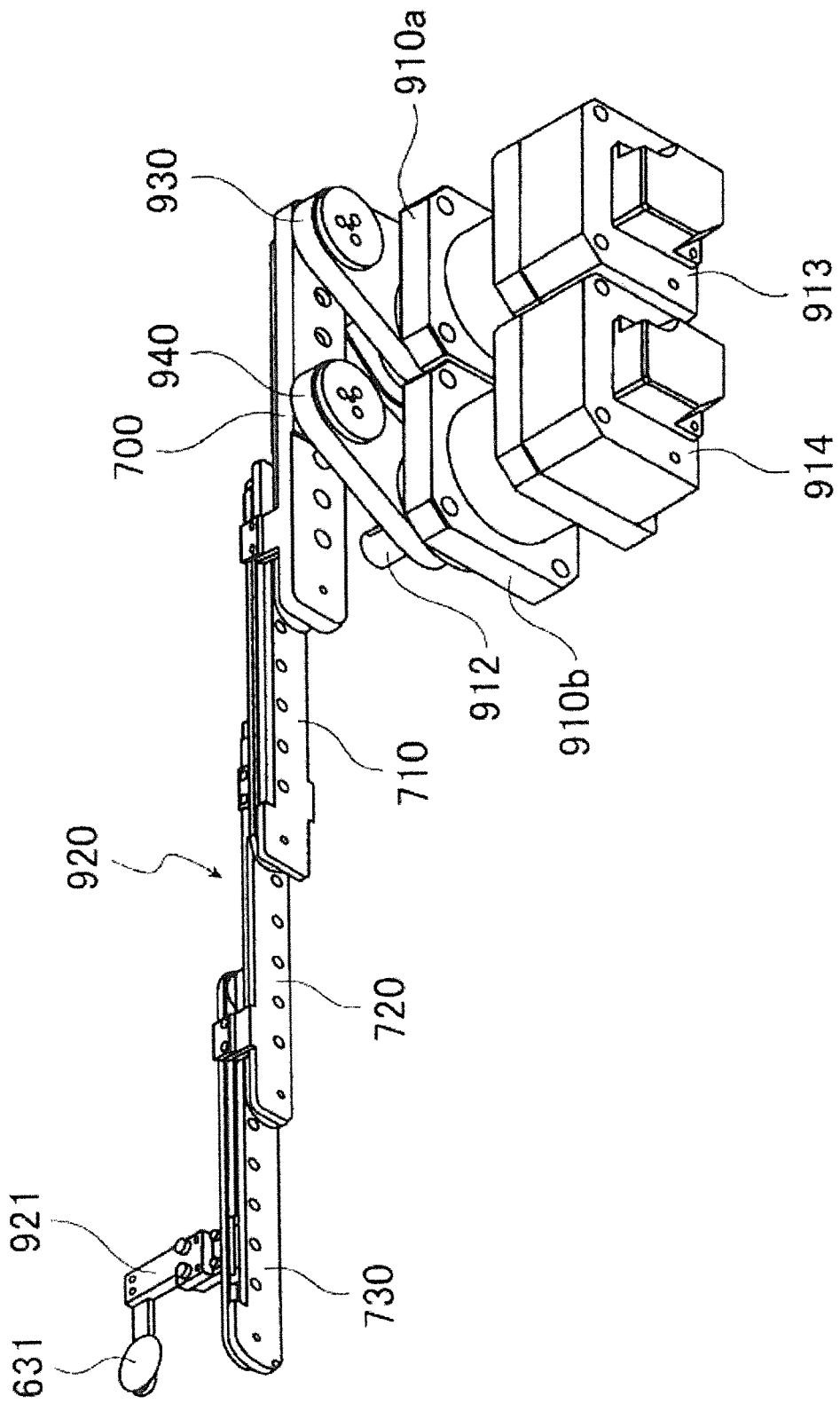
FIG. 10 is a perspective view schematically illustrating the constitution of the link-type transfer robot according to the embodiment 3.
Figure 11:
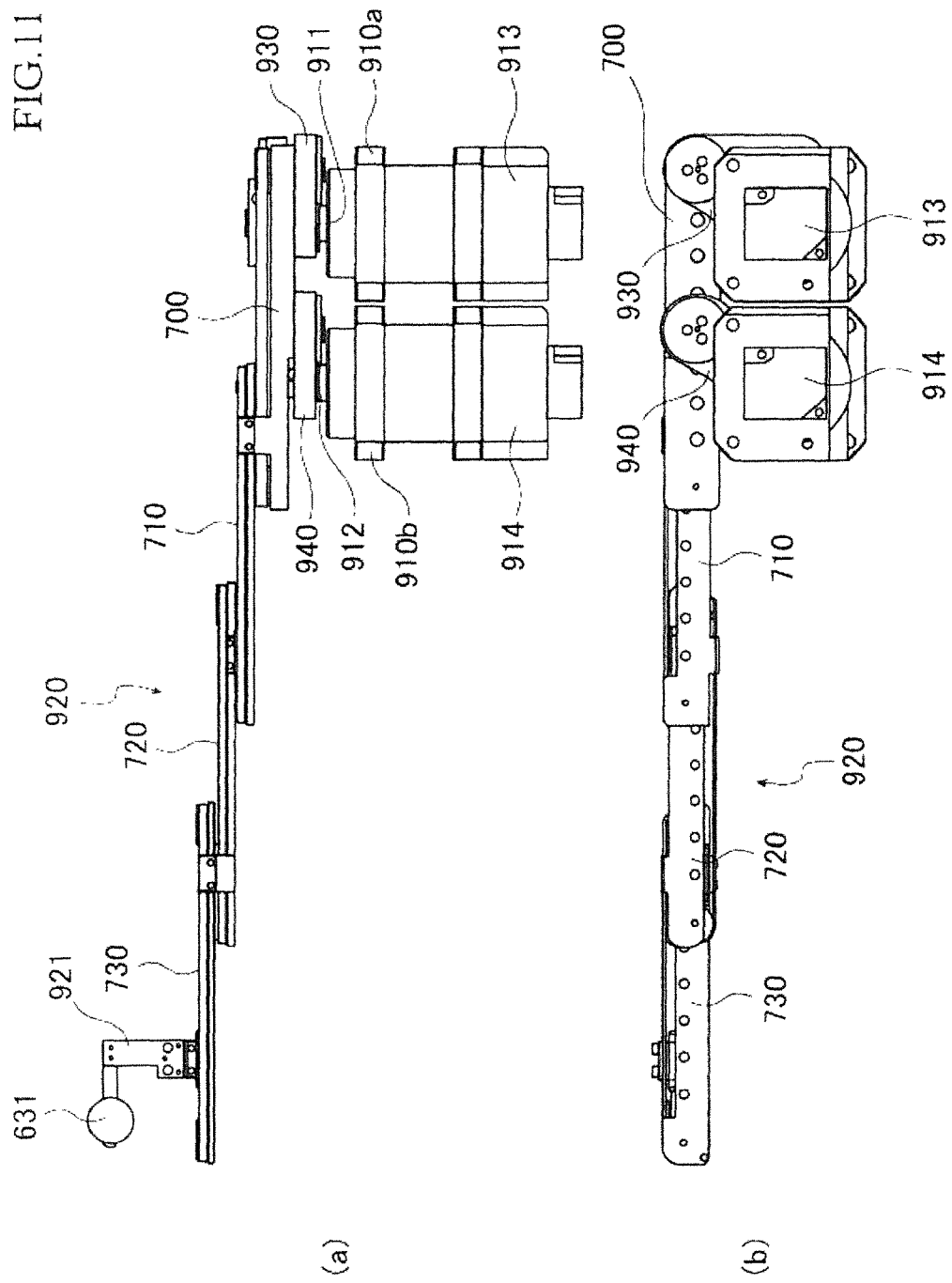
Figure 12:
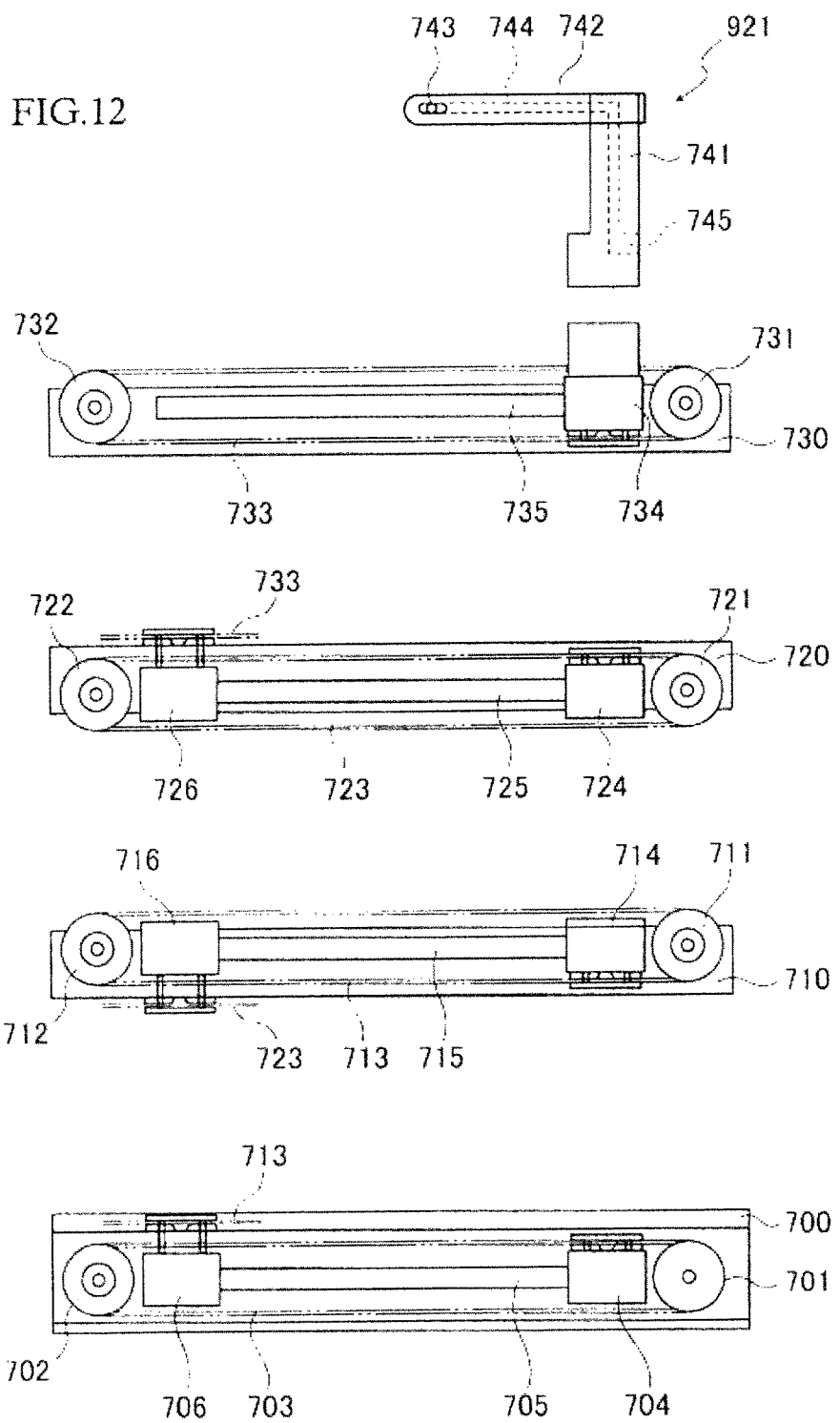
FIG. 12 is an exploded view schematically illustrating the constitution of the link-type transfer robot according to the embodiment 3.

Subsequently, a structure of the link-type transfer robot 642 will be described. FIGS. 9 to 12 illustrate the structure of the link-type transfer robot 642, in which FIG. 9 and FIG. 10 are perspective views, FIG. 11(a) is a plan view, FIG. 11(b) is a side view, and FIG. 12 is an exploded view of the transfer arm.

The link-type transfer robot 642 of this embodiment 3 includes support members 910a and 910b, a transfer arm 920, and first and second link members 930 and 940. In this embodiment 3, a parallel link mechanism 950 is constituted by these constituent members 910a to 940.

The support members 910a and 910b are fixed to a side wall 620b (see FIG. 7) of the clean chamber 640, for example. These support members 910a and 910b are aligned substantially in the horizontal direction and include one through hole each (not shown). Into these through holes, a first rotating shaft 911 and a second rotating shaft 912 are rotatably inserted. The first rotating shaft 911 and the second rotating shaft 912 are linked to separate power transmitters 913 and 914, respectively. Moreover, the power transmitters 913 and 914 are linked to driving shafts (not shown) of the electric motors 915 and 916 arranged below the clean chamber 640 through a belt (not shown), for example (see FIG. 7). By means of such constitution, the first rotating shaft 911 and the second rotating shaft 912 are individually rotated/driven by the electric motors 915 and 916.

The transfer arm 920 holds the semiconductor wafer 631 by a hand portion 921 and transfers it in the horizontal direction. In this embodiment 3, the transfer arm 920 used is of expandable/contractible type. As the expandable/contractible transfer arm for horizontal transfer, a work transfer device disclosed in Japanese Patent Laid-Open No. 2011-96942 can be employed, for example.

The transfer arm 920 according to this embodiment 3 has a structure in which a first slide arm 710, a second slide arm 720, a third slide arm 730, and the hand portion 921 are laminated in the horizontal direction on an arm body 700.

As illustrated in FIG. 12, on both ends of the arm body 700, a driving pulley 701 and a driven pulley 702 are provided. The pulleys 701 and 702 are rotatably supported on the arm body 700. And an arm belt 703 is wound between these pulleys 701 and 702. Moreover, the arm body 700 includes a slide member 704. The slide member 704 is constituted to be movable in a longitudinal direction by guidance of a guide rail 705. Moreover, this slide member 704 sandwiches the belt 703 and also is linked/fixed to a side surface of the first slide arm 710. In addition, the arm body 700 includes a transmission member 706. This transmission member 706 is arranged in the rear of the driven pulley 702 and is fixed to the arm body 700. Then, this transmission member 706 sandwiches a belt 713 of the first slide arm 710.

On both ends of the first slide arm 710, pulleys 711 and 712 are rotatably provided, and the belt 713 is wound between these pulleys 711 and 712. A slide member 714 of the first slide arm 710 is constituted to be movable in the longitudinal direction by guidance of a guide rail 715. This slide member 714 sandwiches the belt 713 and also linked/fixed to a side surface of the second slide arm 720. A transmission member 716 of the first slide arm 710 is arranged in the rear of the pulley 712 and is fixed to the first slide arm 710. This transmission member 716 sandwiches a belt 723 of the second slide arm 720.

In the second slide arm 720, pulleys 721 and 722 are rotatably provided on the both ends similarly to the above-described first slide arm, and the belt 723 is wound between these pulleys 721 and 722. A slide member 724 of the second slide arm 710 is constituted movably in the longitudinal direction by guidance of a guide rail 725. Moreover, this slide member 724 sandwiches the belt 723 and is linked/fixed to a third slide arm 730. Furthermore, a transmission member 726 of the second slide arm 720 is arranged in the rear of the pulley 722 and fixed to the second slide arm 720. This transmission member 726 sandwiches a belt 733 of the third slide arm 730.

On both ends of the third slide arm 730, pulleys 731 and 732 are provided. The pulleys 731 and 732 are provided rotatably. The belt 733 is wound between these pulleys 731 and 732. Furthermore, a slide member 734 of the third slide arm 730 is constituted movably in the longitudinal direction by guidance of the guide rail 735. Moreover, this slide member 734 sandwiches the belt 733.

The hand portion 921 includes a horizontal plate 741 extending in a direction orthogonal to an expansion/contraction direction of the transfer arm 623. This horizontal plate 741 is linked/fixed to the slide member 734 of the above-described third slide arm 730. Moreover, the hand portion 921 is fixed to a tip end of this horizontal plate 741 and includes a wafer holding portion 742 extending in the expansion/contraction direction of the transfer arm 623. In a tip end portion of the wafer holding portion 742, a suctioning hole 743 for vacuum-suctioning the semiconductor wafer 631 is provided. This suctioning hole 743 is connected to a suction port 745 through a suction tube 744. The suction port 745 is connected to a vacuum pump (not shown) through a piping (not shown) made of a resin.

The first link member 930 is, as illustrated in FIG. 9, rotatably linked to the first rotating shaft 911 on a lower end portion and also rotatably linked to the transfer arm 920 on an upper end portion. In this embodiment 3, a through hole (not shown) is provided on a lower end portion of the first link member 930, and by inserting the first rotating shaft 911 into this through hole, it is linked to the support member 910*a*. Moreover, the upper end portion of the first link member 930 is linked to the arm body 700 of the transfer arm 920 by using a rotating shaft (not shown) provided on the other side surface of the transfer arm 920 (that is, a side surface on which the driving pulley 701 or the like is not provided), for example. A driving belt 917 is wound between the first rotating shaft 911 and the driving pulley 701. Furthermore, a tension pulley 918 for adjusting a tension of the driving belt 917 is provided on the first link member 930. Similarly to the above-described embodiments 1 and 2, a rotation center of the rotating shaft linking the first link member 930 and the transfer arm 623 is preferably matched with a rotation center of the driving pulley 701. As a result, even if a rotational movement angle of the first link member 930 is changed, a distance between the first rotating shaft 911 and the driving pulley 701 is made constant, and thus, the driving belt 913 can be wound.

The second link member 940 is rotatably linked to the support member 910*b* on a lower end portion and also rotatably linked to the arm body 700 of the transfer arm 920 on an upper end portion. In this embodiment 3, the lower end portion of the second link member 940 is fixedly linked to the second rotating shaft 912.

Subsequently, an operation of the link-type transfer robot 642 according to this embodiment 3 will be described.

Figure 13:
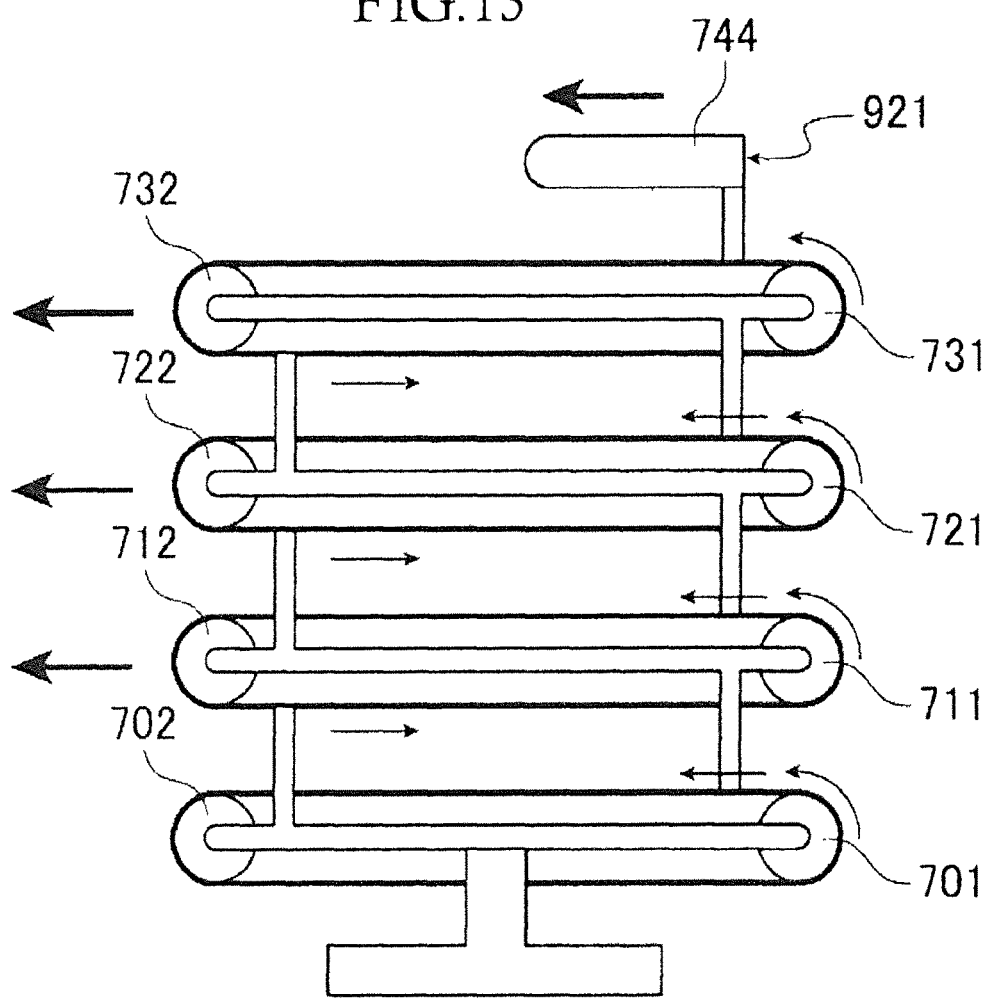
FIG. 13 is a schematic side view for explaining an operation of a transfer arm according to the embodiment 3.

First, an expansion/contraction operation of the transfer arm 920 will be described by using a conceptual view in FIG. 13 and the like.

When the electric motor 915 (see FIG. 7) starts rotation, this rotational driving force is transmitted to the first rotating shaft 911 through the power transmitter 913 (see FIG. 9). When the first rotating shaft 911 rotates, the driving belt 917 is rotationally moved by this rotation, and as a result, the driving pulley 701 also rotationally moves. The arm belt 703 is also wound around the driving pulley 701 in addition to the driving belt 917 and therefore, this arm belt 703 is also rotationally moved (see FIG. 12). As a result, the driven pulley 702 also rotates. By means of rotational movement of the arm belt 703 as above, the slide member 704 fixed to a predetermined spot of this arm belt 703 linearly moves along the rail 705, and as a result, the first slide arm 710 also moves in an expansion direction.

As described above, the transmission member 706 is fixed to the arm body 700 and also sandwiches the belt 713 of the first slide arm 710. Thus, when the first slide arm 710 moves in the expansion direction, the belt 713 of this first slide arm 710 starts rotational movement.

When the belt 713 rotationally moves, the slide member 714 of the first slide arm 710 moves in the expansion direction by being guided by the rail 715. Therefore, the second slide arm 720 moves in the expansion direction relatively to the first slide arm 710. When the second slide arm 720 relatively moves, the belt 723 of the second slide arm 720 is rotationally moved by the transmission member 716 of the first slide arm 710.

When the belt 723 is rotationally moved, the slide member 724 of the second slide arm 720 is moved in the expansion direction by being guided by the rail 725. As a result, the third slide arm 730 moves in the expansion direction relatively to the second slide arm 720. When the third slide arm 730 moves relatively, the belt 733 of the third slide arm 730 is rotationally moved by the transmission member 726 of the second slide arm 720.

When the belt 733 is rotationally moved, the slide member 734 of the third slide arm 730 is moved in the expansion direction by being guided by the rail 735. As a result, the hand portion 921 moves in the expansion direction relatively to the third slide arm 730.

As described above, by means of the rotation of the first rotating shaft 911, the transfer arm 623 is expanded, whereby the hand portion 921 can be advanced. Then the semiconductor wafer 631 held by this hand portion 921 is horizontally transferred forward.

On the other hand, when the electric motor 915 rotates the first rotating shaft 911 in an opposite direction, the semiconductor wafer 631 is horizontally transferred rearward.

Subsequently, an operation of carrying the semiconductor wafer 631 into the processing chamber 610 by using the link-type transfer robot 642 will be described by using FIGS. 14 to 16 and the like.

First, when the wafer transfer container 630 is not set, the elevating body 641 has risen to the highest position and closes a carrying-in port of the container placing table 621. In this state, the wafer transfer container 630 is set on the container placing table 621 (see FIG. 14). At this time, a delivery bottom portion 632 of the wafer transfer container 630 is held by the elevating body 641 by an attractive force of an electromagnet (not shown) or the like, for example.

After being set on the container placing table 621, the wafer transfer container 630 is pressed and fixed onto this container placing table 621 by pressing down the lever 622 (see FIG. 6 and FIG. 7).

Subsequently, by lowering of the elevating shaft 643 by an elevating motor mechanism, not shown, the elevating body 641 is lowered. As a result, the delivery bottom portion 632 of the wafer transfer container 630 is lowered in a state held by the elevating body 641. As a result, the semiconductor wafer 631 is carried into the apparatus antechamber 620 in a state placed on the delivery bottom portion 632. When the delivery bottom portion 632 has been lowered, a lid portion 633 of the wafer transfer container 630 closes the container placing table 621 as it is.

When the elevating body 631 has lowered to and stopped at a predetermined position, then, the transfer arm 920 of the link-type transfer robot 642 starts the expansion operation so that the hand portion 921 enters immediately below the semiconductor wafer 631. Then, the link-type transfer robot 642 raises the hand portion 921 in the vertical direction and attracts/holds the semiconductor wafer 631 (see FIG. 15). A method for vertically raising the hand portion 921 is similar to the embodiment 1. That is, the electric motor 916 rotates the second rotating shaft 912 and rotationally moves the first and second link members 930 and 940, while the electric motor 915 rotates the first rotating shaft 911 and retreats the hand portion 921 at a predetermined speed, whereby this hand portion 921 can be vertically raised. After that, the electric motor 916 is stopped and stops raising of the hand portion 921.

Subsequently, by rotation of the first rotating shaft 911 by the electric motor 915, the transfer arm 920 is expanded, and the semiconductor wafer 631 is transferred to the wafer placing table 611 in the processing chamber 610. Then, the electric motor 916 rotates the second rotating shaft 912 again and rotationally moves the first and second link members 930 and 940 and at the same time, the electric motor 915 rotates the first rotating shaft 911 and retreats the hand portion 921 at a predetermined speed so as to vertically lower the hand portion 921. As a result, the semiconductor wafer 631 is placed on the wafer placing table 611 (see FIG. 16). After that, the electric motor 916 is stopped and stops lowering of the hand portion 921, and the electric motor 915 continuously rotates and retreats the hand portion 921 so as to retract the transfer arm 920 from the processing chamber 610.

Figure 14:
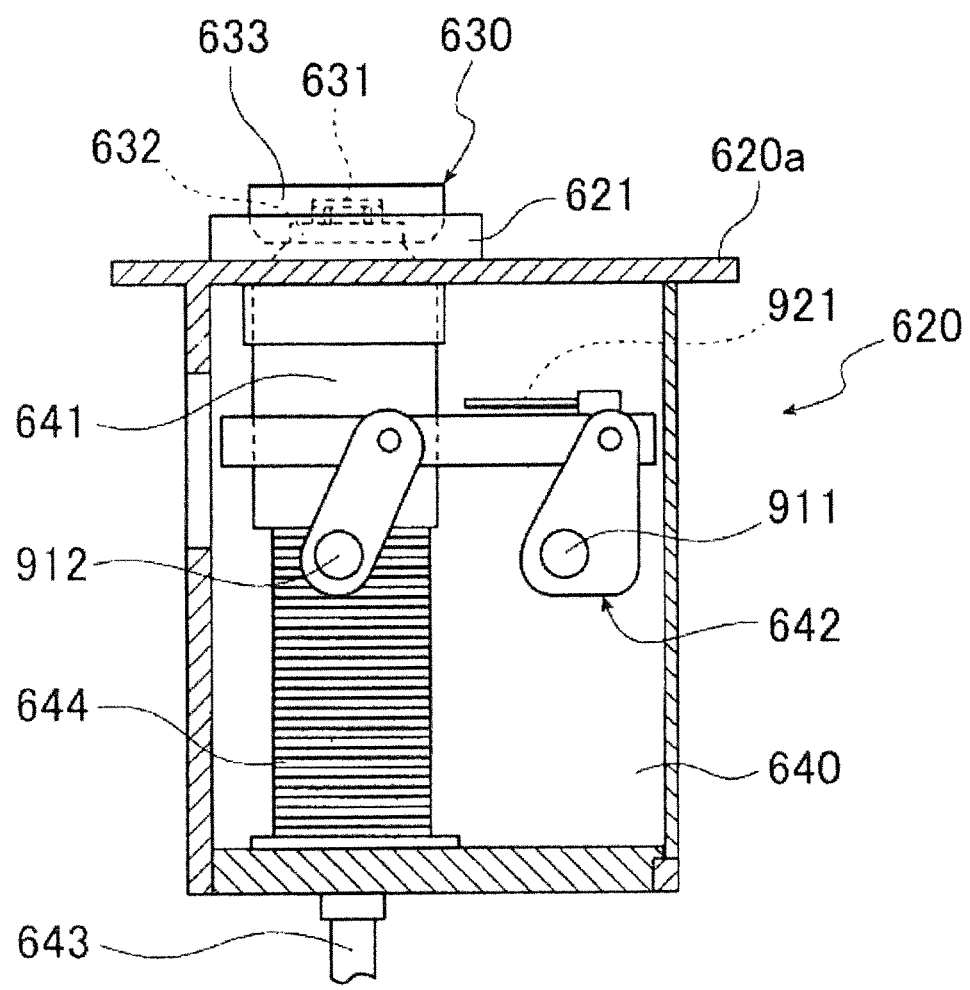
FIG. 14 is a schematic side view for explaining an operation of the link-type transfer robot according to the embodiment 3.
Figure 15:
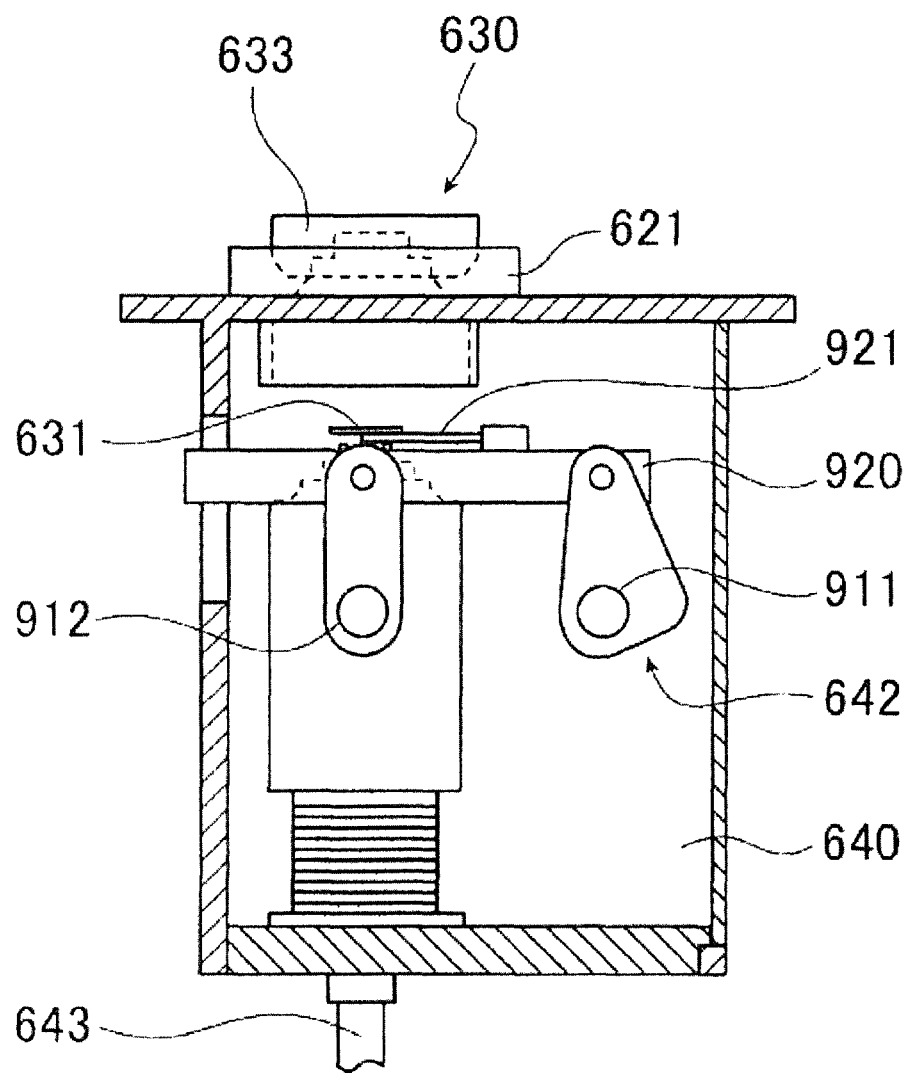
FIG. 15 is a schematic side view for explaining the operation of the link-type transfer robot according to the embodiment 3.
Figure 16:
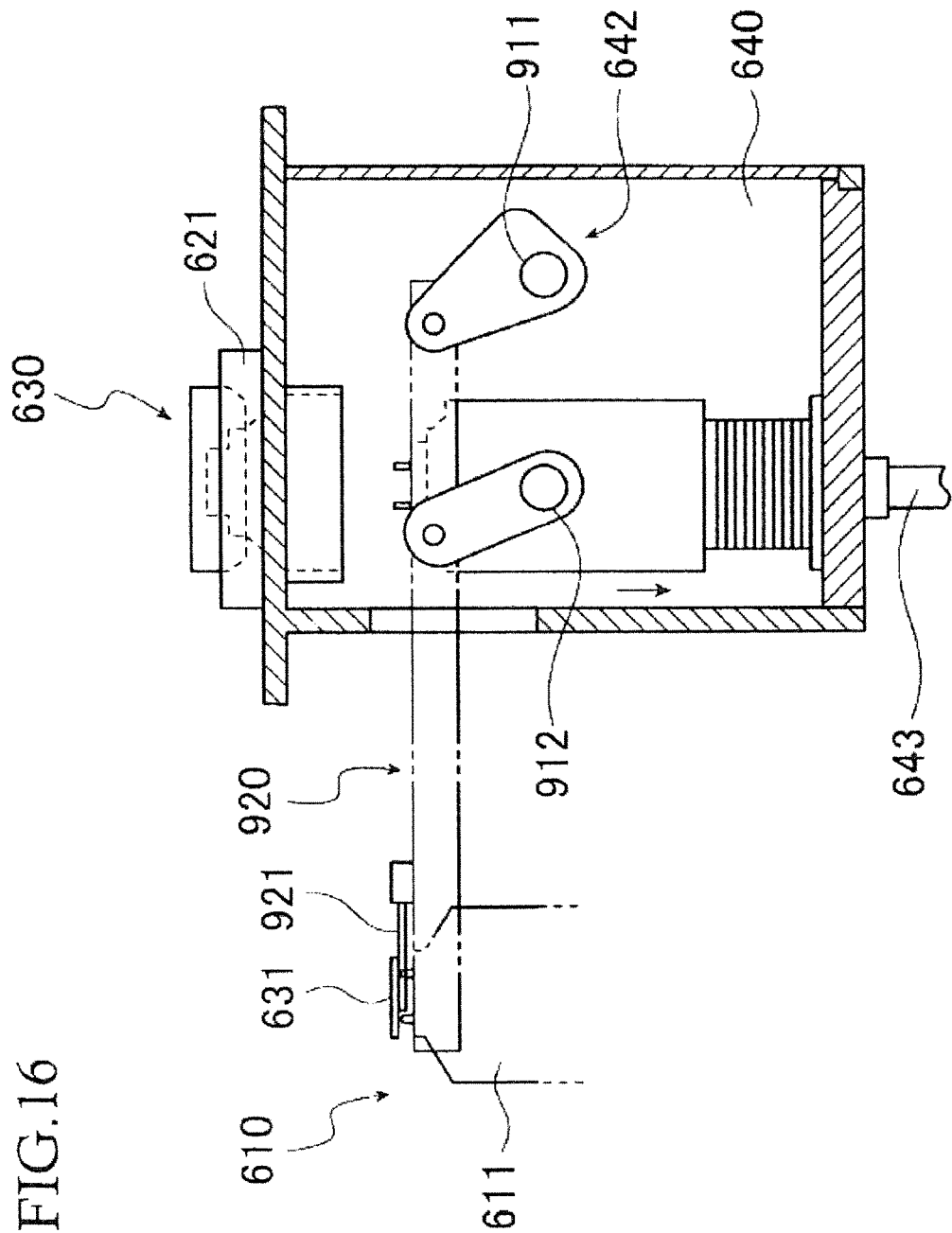
FIG. 16 is a schematic side view for explaining the operation of the link-type transfer robot according to the embodiment 3.

On the other hand, the semiconductor wafer 631 can be carried out of the processing chamber 610 by an operation opposite to FIGS. 14 to 16.

According to this embodiment 3, since the hand portion 921 can be horizontally moved by using the rotating operation of the parallel link mechanism 950 and the expansion/contraction operation of the transfer arm 920, there is no need to perform the arm folding operation for horizontal movement and thus, the occupied area of the transfer robot can be kept small.

Moreover, similarly to the above-described embodiments 1 and 2, since horizontal movement and vertical movement of the hand portion 921 can be performed only by rotation of the first and second rotating shafts 911 and 912, there is no need to use a linear shaft. Thus, even if the power source (electric motor or the like) of the transfer robot is arranged outside the chamber such as the clean chamber 640 or the like, sealing can be performed easily and at the same time, since the power of the power source can be kept small, size reduction or the like of the transfer robot is easy.

In addition, similarly to the above-described embodiments 1 and 2, by matching the rotation center of the rotating shaft linking the first link member 930 to the transfer arm 920 with the rotation center of the driving pulley 701, the rotational power can be transmitted from the support members 910*a* and 910*b* to the transfer arm 920 and thus, arrangement of the rotational power source outside the clean chamber 640 is made easy.

In this embodiment 3, the first rotating shaft 911 is used for rotational driving of the driving pulley 701 and the second rotating shaft 912 is used for rotational driving of the parallel link mechanism 950, but the link-type transfer robot can be constituted such that the first rotating shaft 911 is used for rotational driving of the parallel link mechanism 950, and the second rotating shaft 912 is used for rotational driving of the driving pulley 701. Moreover, it is also possible to constitute the link-type transfer robot by making the first rotating shaft 911 or the second rotating shaft 912 a tri-axis concentric rotating shaft so that the driving pulley 701 and the parallel link mechanism 950 are both rotated/driven by this concentric rotating shaft.

In this embodiment 3, the driving belt 917 is used as means for transmitting the rotational power of the first rotating shaft 911 to the driving pulley 701, but other methods (a gear or the like, for example) may be used.

In this embodiment 3, the example in which the one expandable/contractible transfer arm 920 is mounted on the one parallel link mechanism 950 is illustrated, but by using the concentric rotating shaft as illustrated in the above-described embodiment 2 as the first rotating shaft, the driving pulley, and the driven pulley, two or more expandable/contractible transfer arms 920 can be also mounted on the one parallel link mechanism.

In this embodiment 3, the hand portion 921 is linearly moved by using the driving pulleys 701, 711, 721, and 731, the driven pulleys 702, 712, 722, and 732, and the arm belts 703, 713, 723, and 733, but a mechanism for linearly moving the hand portion 921 is arbitrary. For example, a wire or the like may be used instead of the arm belts 703, 713, 723, and 733, and moreover, a rack-and-pinion or the like may be employed.

In this embodiment 3, the link-type transfer robot 642 having the expandable/contractible transfer arm 920 is mounted on the apparatus antechamber 620, but the link-type transfer robots 100 and 500 (see FIG. 1, FIG. 5A, FIG. 5B and the like) as illustrated in the above-described embodiment 1 or embodiment 2 may be mounted on the apparatus antechamber 620 of the semiconductor manufacturing apparatus 600.

In this embodiment 3, explanation is made by using the semiconductor manufacturing apparatus using a semiconductor wafer as an example, but the present invention can be also applied to manufacturing apparatuses for manufacturing a device from other types of substrates (an insulting substrate such as a sapphire substrate, a conductive substrate such as an aluminum substrate and the like, for example) and a non-disc-shaped (a rectangular, for example) treated substrate.

This embodiment 3 can be also applied to a manufacturing apparatus for manufacturing not only the semiconductor device but also other types of devices (an optical element or an optical device of an optical integrated circuit and the like, for example).

Moreover, this embodiment 3 can be applied not only to an apparatus for processing a substrate but also to an apparatus executing the other steps (a device inspection step, for example) in a manufacturing process.

In this embodiment 3, the semiconductor wafer 631 is vacuum-chucked to the tip end portion of the wafer holding portion 742, but other methods can be used as the holding method of the semiconductor wafer 631. For example, if the link-type transfer robot 642 is arranged in the vacuum chamber, a holding method such as an electrostatic chuck or the like is used.

In this embodiment 3, when the semiconductor wafer 631 is placed on the wafer placing table 611, the hand portion 921 is vertically lowered by retreating the hand portion 921 at the predetermined speed (see FIG. 16), but it is also possible to perform placement or delivery of the semiconductor wafer 631 by diagonally moving the hand portion 921 without vertical movement.

REFERENCE SIGNS LIST 100, 500, 642 link-type transfer robot
110, 510, 910a, 919b support member
111, 511, 911 first rotating shaft
112, 512, 912 second rotating shaft
113, 513a, 513b, 917 driving belt
120, 520, 920 transfer arm
121, 521, 700 arm body
122 rail
123, 523, 701 driving pulley
124, 524, 702 driven pulley
125, 525a, 525b, 703 arm belt
123, 526a, 526b, 921 hand portion
130, 530, 930 first link member
140, 540, 940 second link member

The invention claimed is:

1. A link-type transfer robot comprising:
a hand portion to hold a work, the hand portion being linearly moveable;
a transfer arm to hold the hand portion;
a support member with a fixed position;
a first link member, one end portion of which is rotatably linked to the support member and another end portion of which is rotatably linked to the transfer arm; and
a second link member, one end portion of which is rotatably linked to the support member at a position different from the one end portion of the first link member and another end portion of which is rotatably linked to the transfer arm at a position different from the other end portion of the first link member,
wherein the first link member, the second link member, the support member and the transfer arm constitute a parallel link,
a rotating shaft rotated by a rotational driving source provided at the one end portion of the first link member of the parallel link, and the hand portion is linearly moveable with respect to the transfer arm by using a rotational driving force transmitted from the rotating shaft to the other end portion of the first link member of the parallel link, and
the transfer arm is moveable by rotating/driving the first link member or the second link member with respect to the support member.

2. The link-type transfer robot according to claim 1, wherein the hand portion is moved vertically by moving the transfer arm, as the hand portion moves in a direction canceling a horizontal movement component of the transfer arm.

3. The link-type transfer robot according to claim 1, wherein the transfer arm is an expandable/contractible transfer arm comprising a plurality of arm members coupled to each other such that the transfer arm is one of expandable and contractible according to movement of the plurality of arm members.

4. The link-type transfer robot according to claim 1, wherein the rotation driving source is a motor and the transfer arm includes:
a driving pulley rotatably supported in the vicinity of one of end portions of an arm body and driven by the motor;
a driven pulley rotatably supported in the vicinity of another of the end portions of the arm body; and
an arm belt wound between the driving pulley and the driven pulley,
wherein the rotating shaft penetrates the support member and the first link member; and
the arm belt is rotationally moved by transmission of the rotational driving force of the rotating shaft to the driving pulley, and the hand portion is linearly moved by using the rotational moving force of the arm belt.

5. The link-type transfer robot according to claim 4, further comprising:
a plurality of driving pulleys including the driving pulley, the plurality of driving pulleys having a single rotation axis;
a plurality of driven pulleys including the driven pulley, the plurality of driven pulleys having a single rotation axis located at a different location than the single rotation axis of the plurality of driving pulleys;
a plurality of arm belts wound around the plurality of driving pulleys and the plurality of driven pulleys, respectively;
a plurality of hand portions including the hand portion, the plurality of hand portions being provided in correspondence with each of the plurality of arm belts; and
wherein the rotating shaft is among a plurality of concentric rotating shafts;
the plurality of arm belts are rotationally moved by transmitting the rotational driving force from the plurality of concentric rotating shafts including the rotating shaft to the plurality of driving pulleys, respectively, and the plurality of hand portions are linearly moved by using the rotational moving force of the plurality of arm belts, respectively.

6. The link-type transfer robot according to claim 4, wherein the rotating shaft is a first rotating shaft and the link-type transfer robot comprises:
a second rotating shaft penetrating the support member and fixed to the second link member; and
wherein the second link member is rotated/driven by rotating the second rotating shaft.

7. The link-type transfer robot according to claim 4, wherein the rotating shaft is a first rotating shaft and the link-type transfer robot comprises:
a second rotating shaft which is a rotating shaft concentric to the first rotating shaft;
wherein the second rotating shaft is fixed to the first link member; and
the first link member is rotated/driven by rotating the second rotating shaft.

8. The link-type transfer robot according to claim 2, wherein
the transfer arm is an expandable/contractible transfer arm comprising a plurality of arm members coupled to each other such that the transfer arm is one of expandable and contractible according to movement of the plurality of arm members in plural stages.

9. The link-type transfer robot according to claim 2, wherein the rotational driving source is a motor and the transfer arm includes:
a driving pulley rotatably supported in the vicinity of one of end portions of an arm body and driven by the motor;
a driven pulley rotatably supported in the vicinity of the other end portion of the arm body; and
an arm belt wound between the driving pulley and the driven pulley,
wherein the rotating shaft penetrates the support member and the first link member is provided; and
the arm belt is rotationally moved by transmission of the rotational driving force of the rotating shaft to the driving pulley, and the hand portion is linearly moved by using the rotational moving force of the arm belt.

10. The link-type transfer robot according to claim 3, wherein the rotational driving source is a motor and the transfer arm includes:
a driving pulley rotatably supported in the vicinity of one of end portions of an arm body and driven by the motor;
a driven pulley rotatably supported in the vicinity of the other end portion of the arm body; and
an arm belt wound between the driving pulley and the driven pulley,
wherein the rotating shaft penetrates the support member and the first link member is provided; and
the arm belt is rotationally moved by transmission of the rotational driving force of the rotating shaft to the driving pulley, and the hand portion is linearly moved by using the rotational moving force of the arm belt.

11. The link-type transfer robot according to claim 5, wherein the rotating shaft is a first rotating shaft among the plurality of concentric rotating shafts and the link-type transfer robot comprises:
a second rotating shaft among the plurality of concentric rotating shafts, the second rotating shaft penetrating the support member and fixed to the second link member; and
wherein the second link member is rotated/driven by rotating the second rotating shaft.

12. The link-type transfer robot according to claim 5, wherein the rotating shaft is a first rotating shaft among the plurality of concentric rotating shafts and the link-type transfer robot comprises:
a second rotating shaft among the plurality of concentric rotating shafts, the second rotating shaft being a rotating shaft concentric to the first rotating shaft;
wherein the second rotating shaft is fixed to the first link member; and
the first link member is rotated/driven by rotating the second rotating shaft.

13. The link-type transfer robot according to claim 1, comprising:
an arm belt wound between a driving pulley and a driven pulley,
wherein the hand portion is fixed to a location on the arm belt and is linearly moveable with respect to the transfer arm.

14. The link-type transfer robot according to claim 1, wherein the hand portion is vertically moved by rotating the rotating shaft, on which the support member and the first link member are provided, in a clockwise direction.

15. The link-type transfer robot according to claim 1, wherein the rotating shaft is a first rotating shaft and the link-type transfer robot further comprises a second rotating shaft, and
the hand portion is vertically moved by rotating the second rotating shaft, on which the support member and the second link member are provided, in a counterclockwise direction.

* * * * *